United States Patent
Numata et al.

(10) Patent No.: US 7,804,373 B2
(45) Date of Patent: Sep. 28, 2010

(54) METHOD OF FABRICATING HERMETIC TERMINAL AND HERMETIC TERMINAL, METHOD OF FABRICATING PIEZOELECTRIC OSCILLATOR AND PIEZOELECTRIC OSCILLATOR, OSCILLATOR, ELECTRONIC APPLIANCE, AND RADIO CLOCK

(75) Inventors: Masashi Numata, Chiba (JP); Yasuo Kawada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 264 days.

(21) Appl. No.: 12/188,709

(22) Filed: Aug. 8, 2008

(65) Prior Publication Data
US 2009/0039971 A1 Feb. 12, 2009

(30) Foreign Application Priority Data
Aug. 10, 2007 (JP) .............................. 2007-209101

(51) Int. Cl.
H01L 41/00 (2006.01)
H01L 41/053 (2006.01)
H01L 41/22 (2006.01)
H01R 43/00 (2006.01)
H01R 43/04 (2006.01)
H01R 43/20 (2006.01)
H03B 1/00 (2006.01)
H03B 5/32 (2006.01)

(52) U.S. Cl. .................... 331/68; 331/158; 331/187; 29/857; 29/858; 29/861; 310/344; 310/348; 310/351

(58) Field of Classification Search ................... 331/68, 331/69, 108 D, 116 R, 116 FE, 116 M, 154, 331/158, 187; 29/825, 857, 858, 860, 861; 310/340, 344, 348, 351–353, 370
See application file for complete search history.

(56) References Cited

U.S. PATENT DOCUMENTS
5,265,316 A * 11/1993 Ikeda et al. ................. 29/25.35

FOREIGN PATENT DOCUMENTS
JP 2002-043886 2/2002

* cited by examiner

*Primary Examiner*—David Mis
(74) *Attorney, Agent, or Firm*—Brinks Hofer Gilson & Lione

(57) ABSTRACT

A method of fabricating a hermetic terminal includes: joining and firing wherein a bar-shaped member to be a lead is inserted into a ring, and they are fired to form a hermetic terminal intermediate having the bar-shaped member fixed in the ring; flattening wherein an end part of the bar-shaped member to be the inner lead portion of the lead is flattened to form a stair portion; and shaping wherein an end part of the stair portion is cut to shape the stair portion into a predetermined shape, wherein in the joining and firing step, a solid round bar longer than the lead is used as the bar-shaped member, and one end side of the bar-shaped member to be the inner lead portion is inserted into the ring so that the one end side is longer than the inner lead portion in the hermetic terminal as a completed product.

11 Claims, 22 Drawing Sheets

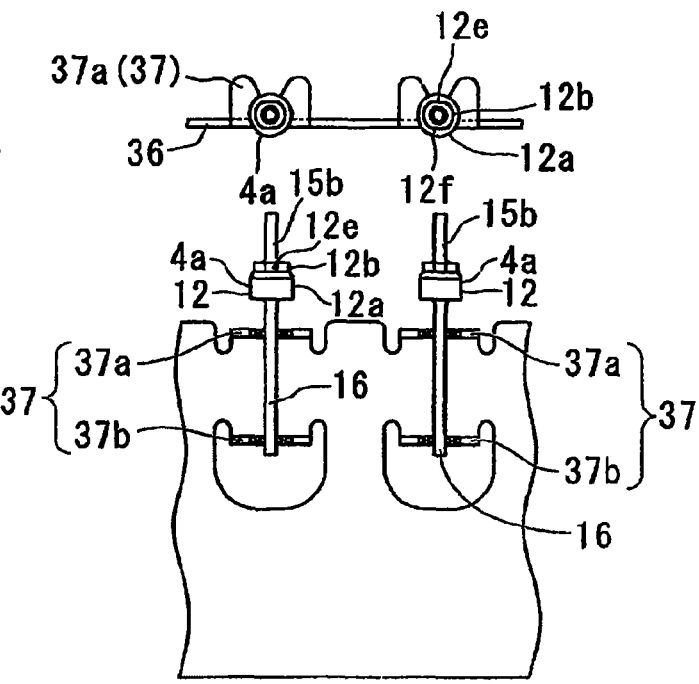
FIG. 14A
FIG. 14B
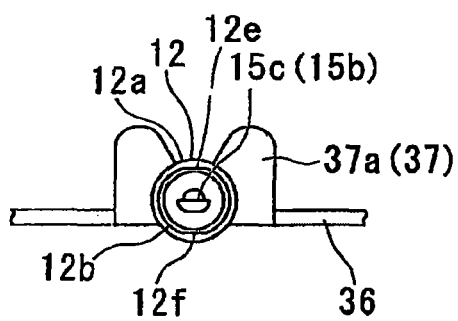
FIG. 15A
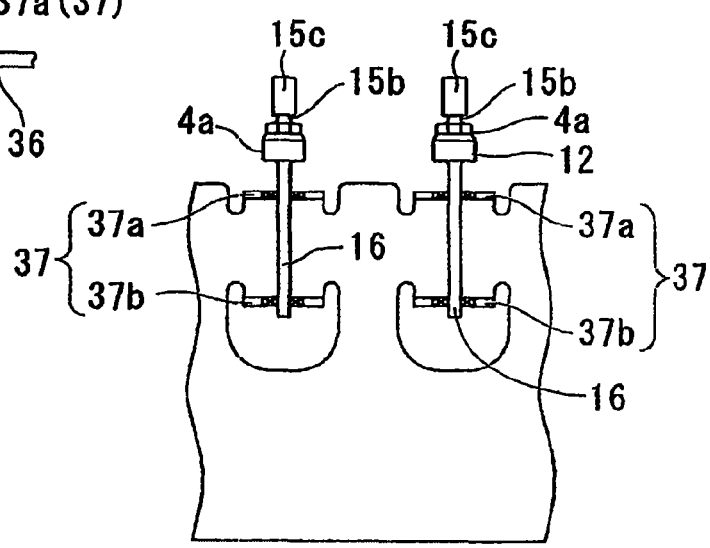
FIG. 15B

METHOD OF FABRICATING HERMETIC TERMINAL AND HERMETIC TERMINAL, METHOD OF FABRICATING PIEZOELECTRIC OSCILLATOR AND PIEZOELECTRIC OSCILLATOR, OSCILLATOR, ELECTRONIC APPLIANCE, AND RADIO CLOCK

RELATED APPLICATIONS

This application claims priority under 35 U.S.C. §119 to Japanese Patent Application No. JP2007-209101 filed on Aug. 10, 2007, the entire content of which is hereby incorporated by reference.

BACKGROUND OF THE INVENTION

1. Field of the Invention

The present invention relates to a method of fabricating a hermetic terminal and a hermetic terminal, a method of fabricating a piezoelectric oscillator and a piezoelectric oscillator, an oscillator, an electronic appliance, and a radio clock.

2. Description of the Related Art

In recent years, mobile telephones and portable information terminal devices employ a piezoelectric oscillator using quartz crystal as a time source, a timing source of control signals, and a reference signal source. As this type of piezoelectric oscillator, various ones are offered. As one of them, a cylinder package piezoelectric oscillator formed in a cylindrical shape is known.

As shown in FIG. 30, a piezoelectric oscillator 70 is configured to have a tuning fork piezoelectric vibrating piece 71, a case 72 in a cylindrical shape with a bottom in which the piezoelectric vibrating piece 71 is accommodated, and a hermetic terminal 73 that hermetically seals the piezoelectric vibrating piece 71 inside the case 72.

The hermetic terminal 73 is configured of an annular ring 74 formed of a metal material, two leads 75 arranged as they penetrate through the ring 74 and are individually joined to two mount electrodes 71a of the piezoelectric vibrating piece 71, and a filler 76 that fixes the leads 75 to the ring 74 in one piece in an insulating state and hermetically seals the inside of the case 72.

The two leads 75 each have an inner lead portion 75a that is the portion extended inside the case 72 and have an outer lead portion 75b that is the portion extended outside the case 72. Then, the outer lead portion 75b functions as an external connecting terminal.

In addition, the case 72 is pressed, fitted, and fixed to the outer side of the ring 74. Since the case 72 is press fitted under a vacuum atmosphere, the space surrounding the piezoelectric vibrating piece 71 inside the case 72 is hermetically sealed in the vacuum state.

In the piezoelectric oscillator 70 thus configured, a predetermined voltage is applied as drive voltage to each of the outer lead portions 75b of the two leads 75, and then current is carried from the inner lead portion 75a to the piezoelectric vibrating piece 71 through the mount electrode 71a. Thus, the piezoelectric vibrating piece 71 oscillates at a predetermined frequency.

This type of piezoelectric oscillator is mounted on various electronic appliances. However, since these electronic appliances are being reduced in size year after year, also in the piezoelectric oscillator, further size reduction is demanded. In order to reduce the size of the piezoelectric oscillator, it is effective to reduce the outer diameter of the ring. To this end, it is necessary to reduce the diameters of two leads. However, in the case in which the leads are made narrower than the current form, the stiffness is decreased, and then it is likely to deform the leads in the process of fabrication. Particularly, the outer lead portions that are longer than the inner lead portions tend to become deformed. When the outer lead portions become deformed, they cannot maintain themselves in the state of being parallel with each other. Thus, the quality is degraded, and the oscillator cannot be used as a product. Consequently, it is likely to cause a reduction in yields.

In addition, in the process of fabrication, the outer lead portions are entangled with the outer lead portions of another hermetic terminal, which might temporarily stop the production line. Also in this point, it is likely to cause a reduction in yields. Particularly, the more size reduction is aimed, the more the problems might occur noticeably. On this account, in the fabricating method under present conditions, it is difficult to fabricate a piezoelectric oscillator of high yields and high quality which can be further reduced in size. Particularly, it is difficult to fabricate a hermetic terminal configuring a piezoelectric oscillator.

Then, a piezoelectric oscillator is provided which has a hermetic terminal with a single lead, not two leads (see Patent Reference 1 (see JP-A-2002-43886)). This hermetic terminal has a projecting piece formed in one piece with a ring, and the projecting piece serves as the role of the inner lead portion before. In other words, the lead and the projecting piece are electrically connected to a piezoelectric vibrating piece. As described above, since the projecting piece formed in one piece with the ring is allowed to function as the inner lead portion, two leads, which are required before, can be reduced to a single lead.

On this account, even though the outer diameter of the ring is reduced, it is unnecessary to reduce the diameter of the lead as compared with the case of using two leads, a reduction in stiffness can be prevented, and the deformation of the lead can be prevented. In addition to this, since a single lead is provided, leads are unlikely to become entangled with each other in the process of fabrication, and thus the hermetic terminal can be reduced in size, and the piezoelectric oscillator can be reduced in size.

In addition, in the hermetic terminal which supports the piezoelectric vibrating piece inside the case including the hermetic terminal 73 of the piezoelectric oscillator 70 shown in FIG. 30 and the hermetic terminal described in the Patent Reference 1, in order to allow the size reduction of the piezoelectric oscillator as well as to ensure the reliability, it is necessary that the piezoelectric vibrating piece is arranged at the position closer to the center inside the case to reliably prevent the piezoelectric vibrating piece from contacting to the case. To this end, the inner lead is not eccentric to the ring and arranged so as to be positioned at the center of the ring. Then, one of the end parts of the inner lead portion supporting the piezoelectric vibrating piece is flattened to form a stair portion, and the stair portion holds the piezoelectric vibrating piece thereon.

In order to fabricate the piezoelectric oscillator provided with the hermetic terminal having the stair portion like this, for example, the lead is inserted into the ring through the filler, they are fired in this state to fix the lead inside the ring with the filler, the lead is flattened to form the stair portion, a bump is formed on the formed stair portion, and then the bump is used as an alignment mark to position the piezoelectric vibrating piece.

However, the method before still has the following problems.

As described above, since it is necessary to arrange the inner lead so that it is positioned at the center of the ring, it is demanded to more reliably prevent the inner lead from being eccentric. The eccentricity of the inner lead to the ring occurs when the filler is fired and the lead is fixed inside the ring. In other words, in the firing process, the ring, the filler, and the lead are joined to each other and accommodated in a firing jig, and then they are fired in this state. However, naturally, since the accommodating portion for the lead in the firing jig is slightly formed greater than the lead, the lead becomes unsteady in the accommodating portion. Then, the lead is unsteady and not arranged in parallel with the center axis of the ring or matched therewith, the lead is accommodated as it is tilted, and the lead is fired and fixed in this attitude, which might cause eccentricity.

In addition, in connecting the piezoelectric vibrating piece to the inner lead, as described above, the bump on the stair portion formed in the flattening process is used as the alignment mark for positioning, but the stair portion formed in the flattening process is a trapezoid, not a rectangle, and also uneven, not uniform. Therefore, the position of the bump formed here is also varied, and thus the piezoelectric vibrating piece positioned by using the bump as the alignment mark also has variations in the connecting position.

In addition, in the hermetic terminal described in Patent Reference 1, it is necessary to form the projecting piece in one piece with the ring. In addition to this, it is necessary to form the projecting piece on a part of the ring formed annular. However, this process is not easily to perform, which takes a lot of efforts and time. Particularly, since it is necessary to bend the projecting piece while the ring is prevented from being deformed in bending the projecting piece, productivity is not excellent. Therefore, actually, it is necessary to produce a large amount of hermetic terminals a day, but the hermetic terminal is not suited for such mass production.

SUMMARY OF THE INVENTION

The invention is made in the light of circumstances. An object is to provide a method of fabricating a hermetic terminal and a hermetic terminal which prevent a lead from being eccentric and enhance the reliability of a position of connecting a piezoelectric vibrating piece, a method of fabricating a piezoelectric oscillator and a piezoelectric oscillator which prevent excitation electrodes provided on two surfaces of a piezoelectric vibrating piece from being short-circuited to each other as well as allow size reduction in addition to high reliability of the connecting position of the piezoelectric vibrating piece, and an oscillator, an electronic appliance, and a radio clock which include the piezoelectric oscillator.

In order to solve the problems, a method of fabricating a hermetic terminal according to the invention is a method of fabricating a hermetic terminal having an annular ring, a lead arranged to penetrate through the ring in which one end side thereof is an inner lead portion electrically connected to a piezoelectric vibrating piece and the other end side thereof is an outer lead portion electrically connected to outside as the ring is between them, and a filler fixing the lead to the ring, wherein the hermetic terminal seals the piezoelectric vibrating piece inside a case, the method including the steps of: joining and firing wherein a bar-shaped member to be the lead is inserted into the ring through the filler, and they are fired in this state to form a hermetic terminal intermediate having the bar-shaped member fixed in the ring with the filler; flattening wherein an end part of the bar-shaped member of the hermetic terminal intermediate to be the inner lead portion of the lead is flattened to form a stair portion; and shaping wherein at least an end part of the stair portion is cut to shape the stair portion into a predetermined shape, wherein in the joining and firing step, a solid round bar longer than the lead is used as the bar-shaped member, and one end side of the bar-shaped member to be the inner lead portion is inserted into the ring so that the one end side is longer than the inner lead portion in the hermetic terminal as a completed product.

According to the method of fabricating a hermetic terminal, in the joining and firing step, the solid round bar longer than the lead is used as the bar-shaped member to be the lead, one end side of the bar-shaped member to be the inner lead portion is inserted into the ring so that the one end side is longer than the inner lead portion in the hermetic terminal as a completed product, and then they are accommodated in a firing jig. Thus, the one end side to be the inner lead portion extended from the ring does not become extremely shorter than the other end side to be the outer lead portion. Therefore, as compared with the case in which one end side to be the inner lead portion has the same length as that of the inner lead portion in the hermetic terminal as a completed product, the one end side and the other end side of the bar-shaped member are extended from the ring relatively in good balance. Accordingly, the degree that the bar-shaped member is inclined to the center axis of the ring is made smaller, whereby the inner lead formed from the bar-shaped member is prevented from being eccentric.

In addition, the end part of the bar-shaped member to be the inner lead portion of the lead is flattened to form the stair portion, at least the end part of the stair portion is cut, and then the stair portion is shaped into a predetermined shape. Thus, the form of the stair portion becomes a uniform rectangle, for example, whereby variations in the position of a bump formed therein are suppressed.

In addition, preferably, in the method of fabricating a hermetic terminal, the lead is a single lead.

As compared with the case in which the lead is two leads, in the case in which the lead is a single lead, the position of the piezoelectric vibrating piece connected to the inner lead is greatly affected when the inner lead is eccentric, and it is highly likely to degrade the accuracy of the position of the piezoelectric vibrating piece. Therefore, particularly in the case in which the lead is a single lead, the accuracy of the position of the piezoelectric vibrating piece becomes excellent to exert a remarkable effect of reducing the size of the piezoelectric oscillator and ensuring the reliability.

In addition, since the lead is a single lead, even though the outer diameter of the ring is made smaller, it is unnecessary to reduce the diameter of the lead as compared with the case of two leads, and it is unlikely that leads are not entangled with each other in the process of fabrication. Therefore, the hermetic terminal can be reduced in size, and the piezoelectric oscillator using the same can be reduced in size.

In addition, in the method of fabricating a hermetic terminal, preferably, in the joining and firing step, one end side of the bar-shaped member to be the inner lead portion is inserted into the ring so that the one end side is longer than the inner lead portion of the hermetic terminal as a completed product in a range of 1.5 times to 3 times.

When the length is below 1.5 times, as described above, in accommodating the bar-shaped member in the firing jig, the one end side to be the inner lead portion and the other end side to be the outer lead portion are not extended from the ring enough in good balance, and the effect of preventing the eccentricity of the inner lead is reduced. In addition, when the length is 3 times or above, the portion to cut in the shaping step becomes large, which increases material costs. Therefore, the length is set in the range of 1.5 times to 3 times, whereby the effect of preventing the eccentricity of the inner lead can be sufficiently ensured as well as an increase in material costs can be suppressed at the minimum.

In addition, in the method of fabricating a hermetic terminal, preferably, between the joining and firing step and the flattening step, the step of setting is provided wherein the hermetic terminal intermediate after the joining and firing step is set in a holding member.

With this configuration, for example, in the case in which a belt shaped holding member is used as the holding member, the end part of the held hermetic terminal intermediate to be the inner lead portion can be flattened while the holding member is being moved in the length direction. Thus, the flattening step can be automated highly efficiently (at high speed).

A hermetic terminal according to the invention is fabricated according to the fabricating method described above.

According to the hermetic terminal, as discussed above, the lead is prevented from being eccentric, and the reliability of the position of connecting the piezoelectric vibrating piece is improved. Therefore, the piezoelectric oscillator using the hermetic terminal can be reduced in size, and the reliability can be ensured.

A method of fabricating a piezoelectric oscillator according to the invention is a method of fabricating a piezoelectric oscillator including: a piezoelectric vibrating piece, a case having an opening for accommodating the piezoelectric vibrating piece therein; and a hermetic terminal having an annular ring, a lead arranged to penetrate through the ring in which one end side thereof is an inner lead portion electrically connected to a piezoelectric vibrating piece and the other end side thereof is an outer lead portion electrically connected to outside as the ring is between them, and a filler fixing the lead to the ring, wherein the hermetic terminal seals the piezoelectric vibrating piece inside a case, wherein the hermetic terminal is fabricated by the fabricating method above.

In addition, a piezoelectric oscillator according to the invention is fabricated according to the fabricating method described above.

According to the method of fabricating a piezoelectric oscillator and the piezoelectric oscillator obtained by the method, particularly as to the manufacture of the hermetic terminal, as discussed above, since the lead is prevented from being eccentric and the reliability of the position of connecting the piezoelectric vibrating piece is improved, the piezoelectric oscillator can be reduced in size, and the reliability can be ensured.

In addition, in the piezoelectric oscillator, preferably, the case is configured with conductivity; the ring has: a press fitting portion press fitted into an opening of the case, and a reducing portion extended from the press fitting portion with a clearance to the inner side surface of the case with conductivity, the lead is a single lead, the piezoelectric vibrating piece in a plate shape is arranged in the case and has an excitation electrode on each of two surfaces thereof, wherein one of the excitation electrodes is connected to the inner lead portion of the lead through a bump, whereby the piezoelectric vibrating piece is supported by the inner lead portion, and the other one on the opposite side of the excitation electrode is wire bonded to the outer side surface of the reducing portion of the ring.

According to the piezoelectric oscillator, since one of the excitation electrodes of the piezoelectric vibrating piece is connected to the inner lead portion through the bump, and the other one is wire bonded to the reducing portion of the ring, the size can be reduced while the excitation electrodes are prevented from being short-circuited to each other as well as the piezoelectric oscillator can be readily fabricated with excellent yields.

In addition, since the lead is a single lead, even though the outer diameter of the ring is made smaller, it is unnecessary to reduce the diameter of the lead as compared with the case of two leads, and it is unlikely that leads are entangled with each other in the process of fabrication. Therefore, the hermetic terminal can be reduced in size, and thus the piezoelectric oscillator itself can be reduced in size.

In addition, an oscillator according to the invention includes the piezoelectric oscillator connected to an integrated circuit as an oscillating element.

In addition, an electronic appliance according to the invention includes the piezoelectric oscillator.

In addition, a radio clock according to the invention includes the piezoelectric oscillator electrically connected to a filter part.

In accordance with the oscillator, the electronic appliance, and the radio clock according to the invention, since they include the small-sized piezoelectric oscillator with its reliability ensured, the oscillator, the electronic appliance, and the radio clock themselves can be reduced in size as well as their reliability can be improved.

In accordance with the method of fabricating a hermetic terminal according to the invention, and the hermetic terminal according to the invention obtained by the method, since the lead is prevented from being eccentric and the reliability of the position of connecting the piezoelectric vibrating piece is improved, the piezoelectric oscillator using the hermetic terminal can be reduced in size, and the reliability can be ensured.

In accordance with the method of fabricating a piezoelectric oscillator according to the invention, and the piezoelectric oscillator according to the invention obtained by the method, particularly as to the manufacture of the hermetic terminal, as discussed above, since the lead is prevented from being eccentric and the reliability of the position of connecting the piezoelectric vibrating piece is improved, the piezoelectric oscillator can be reduced in size, and the reliability can be ensured.

In accordance with the oscillator, the electronic appliance, and the radio clock according to the invention, the oscillator, the electronic appliance, and the radio clock themselves can be reduced in size as well as their reliability can be improved.

BRIEF DESCRIPTION OF THE DRAWINGS

FIGS. 14A and 14B each show an illustration depicting a setting step in the fabrication process steps of the piezoelectric oscillator according to the first embodiment of the invention;

FIGS. 15A and 15B each show an illustration depicting a flattening step in the fabrication process steps of the piezoelectric oscillator according to the first embodiment of the invention;

DETAILED DESCRIPTION OF THE PREFERRED EMBODIMENTS

First Embodiment

Figure 1:
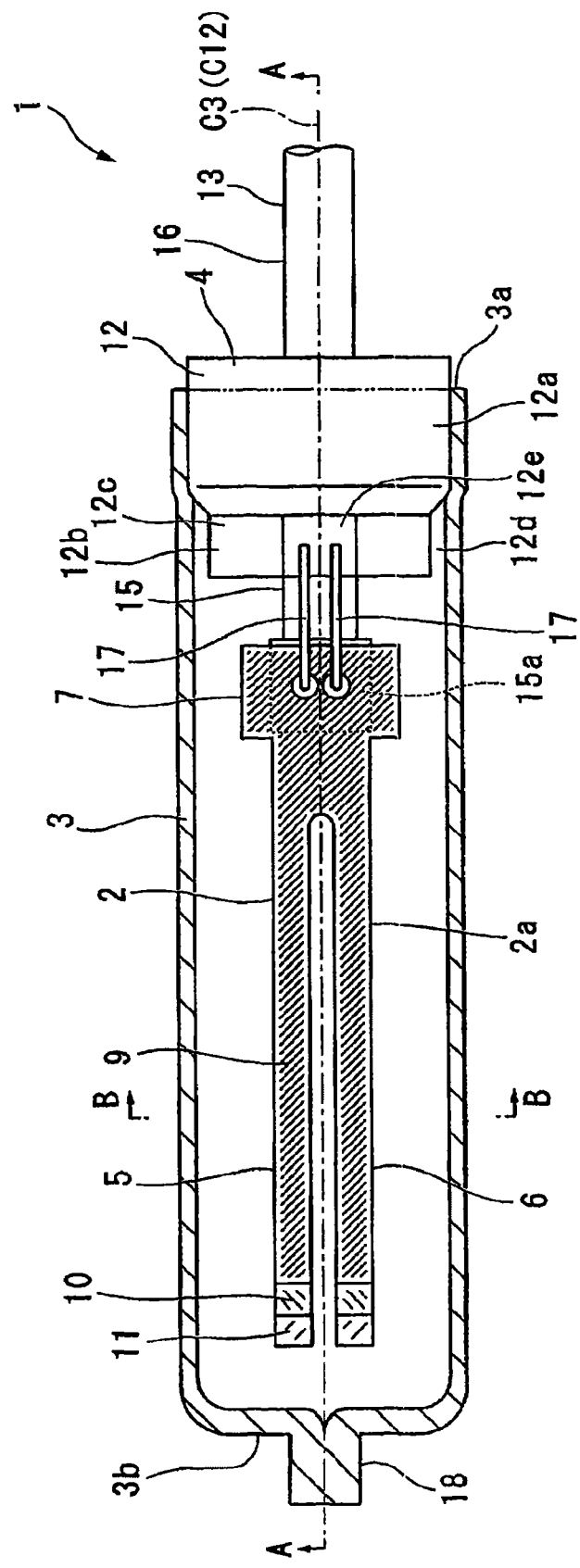
FIG. 1 shows a top view depicting the piezoelectric oscillator according to a first embodiment of the invention.
Figure 2:
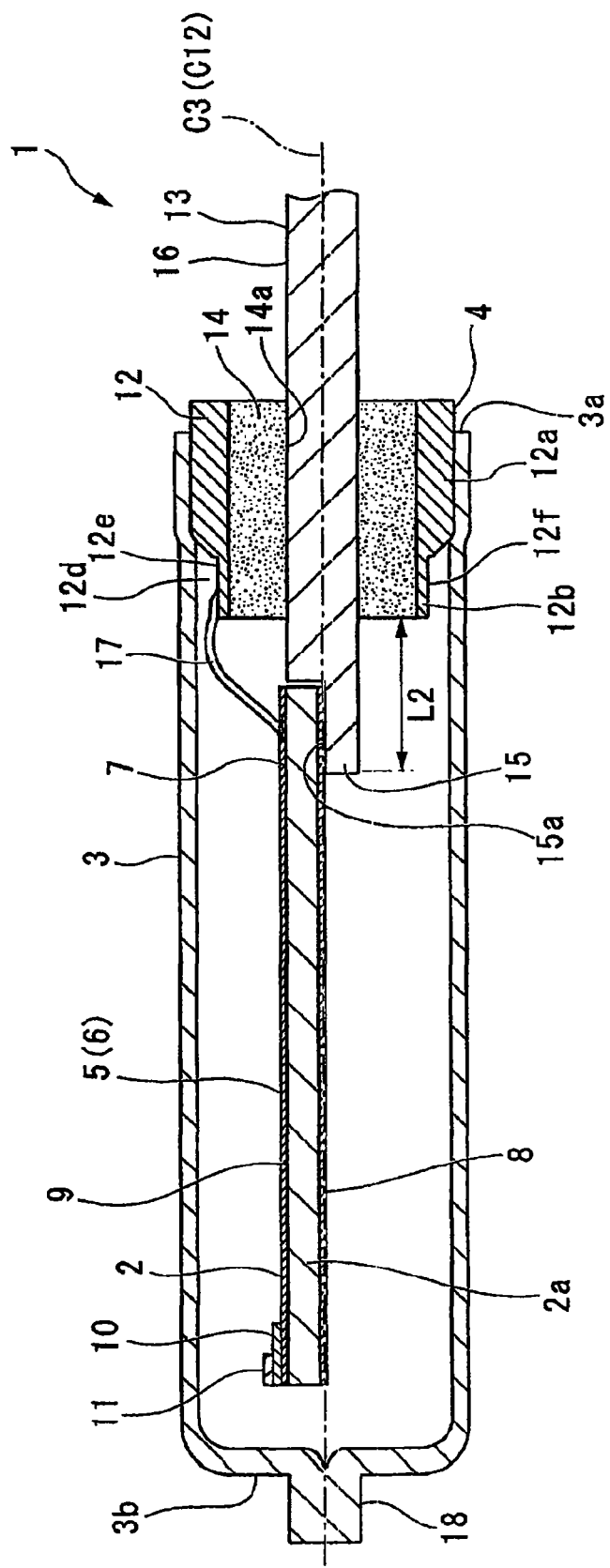
FIG. 2 shows a cross section in a cutting line A-A in FIG. 1 depicting the piezoelectric oscillator according to the first embodiment of the invention.
Figure 3:
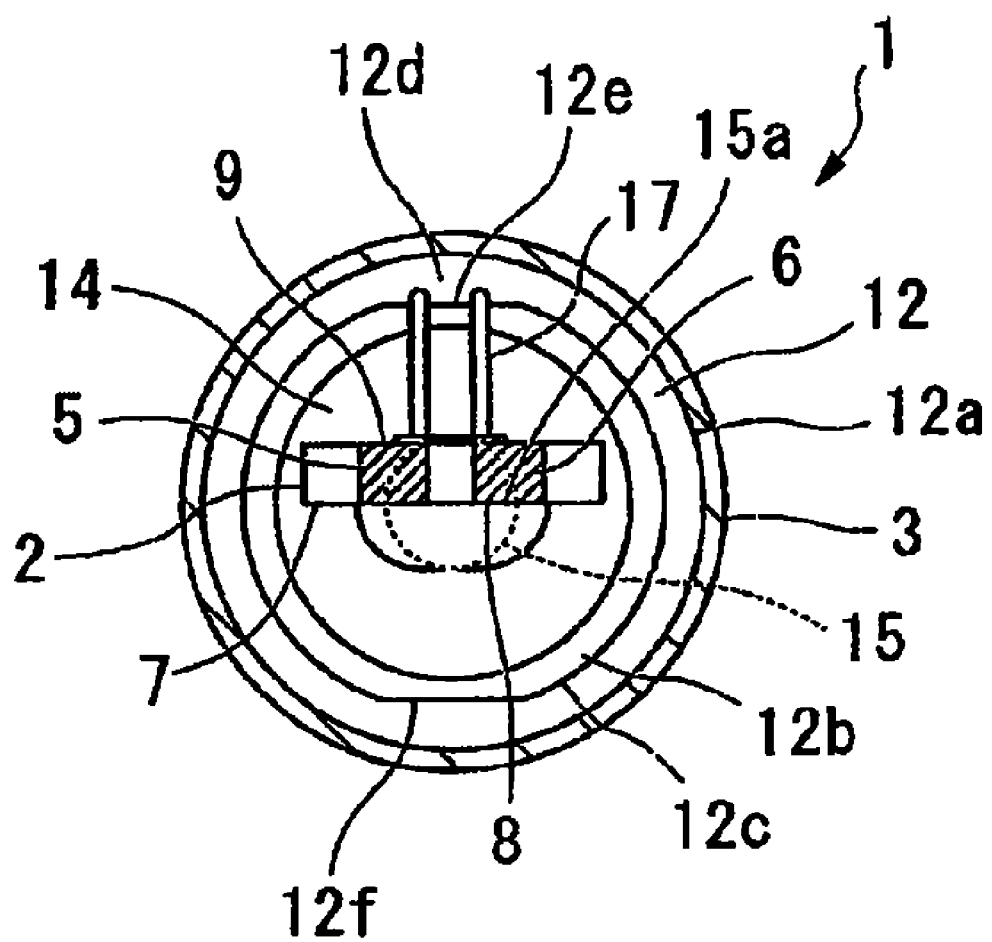
FIG. 3 shows a cross section in a cutting line B-B in FIG. 1 depicting the piezoelectric oscillator according to the first embodiment of the invention.

FIGS. 1 to 3 each show a diagram depicting a piezoelectric oscillator according to a first embodiment of the invention. FIG. 1 shows a cross sectional side view depicting the piezoelectric oscillator according to the embodiment overall, FIG. 2 shows a cross section depicting line A-A shown in FIG. 1, and FIG. 3 shows a cross section depicting line B-B shown in FIG. 1.

As shown in FIGS. 1 to 3, a piezoelectric oscillator 1 according to the embodiment is a cylinder package piezoelectric oscillator, which is configured to include a piezoelectric vibrating piece 2, a case 3 in a nearly cylindrical shape with a bottom which accommodates the piezoelectric vibrating piece 2 therein and covers therearound, and a hermetic terminal 4 which hermetically seals an opening 3a of the case 3. In the embodiment, the piezoelectric vibrating piece 2 is a tuning fork vibrating piece, which is formed of a quartz crystal piece 2a in a nearly plate shape having a pair of oscillating arm portions 5 and 6 adjacently arranged in parallel with each other, and a base portion 7 fixing the base end side of the oscillating arm portions 5 and 6 in one piece. In addition, on each of two surfaces of the quartz crystal piece 2a, a conductive film such as chromium (Cr), nickel (Ni), aluminum (Al) or titanium (Ti) is formed in a predetermined pattern to provide a first excitation electrode 8, and a second excitation electrode 9. The first excitation electrode 8 and the second excitation electrode 9 are electrically isolated to each other and patterned.

Then, voltage is applied to each of the first excitation electrode 8 and the second excitation electrode 9 to oscillate them at a predetermined resonance frequency in the direction of bringing the oscillating arm portions 5 and 6 closer to each other or separating them from each other. In addition, on the tip end side of the oscillating arm portions 5 and 6, at least one of the first excitation electrode 8 and the second excitation electrode 9 has a fine tuning part 10 and a coarse tuning part 11 formed of a chromium (Cr) film. Since the fine tuning part 10 and the coarse tuning part 11 have some cuts by applying a laser beam, whereby the oscillating arm portions 5 and 6 are set to a predetermined resonance frequency.

The hermetic terminal 4 is an embodiment of the hermetic terminal according to the invention, which is configured to include a ring 12 in a nearly cylindrical shape press fitted into the opening 3a of the case 3, a lead 13 inserted into the ring 12, a filler 14 filled between the ring 12 and the lead 13 inside the ring 12 for hermetically sealing the ring 12. The filler 14 is formed of a material having insulating properties. In the embodiment, the filler 14 is formed of a glass ring made of borosilicate glass having a through hole 14a. In other words, the filler 14 is inserted into the ring 12, and fired in the state in which the lead 13 is inserted into the through hole 14a, whereby the filler 14 insulates the ring 12 from the lead 13 as well as hermetically seals in the case 3.

The lead 13 is arranged to be coaxial with a center axis C3 of the case 3 and a center axis C12 of the ring 12, having an inner lead portion 15 extended from the ring 12 to the inner side of the case 3, and a first outer lead portion 16 extended from the ring 12 to the outer side of the case 3, and the lead 13 is formed of a bar-shaped member, described later. On the tip end side of the inner lead portion 15, a bump connecting portion 15*a* is formed, which is formed of a stair portion in a nearly flat surface. In a flattening step, described later, the bump connecting portion 15*a* is formed into the stair portion in which a part (one side) of the lead 13 is flattened to near the center axis C3 to have a nearly flat surface. Then, to the bump connecting portion (stair portion) 15*a*, the first excitation electrode 8 of the piezoelectric vibrating piece 2 is connected through the bump in the base portion 7, whereby the first excitation electrode 8 and the lead 13 are electrically connected to each other, and the piezoelectric vibrating piece 2 is supported by the inner lead portion 15 of the lead 13 in an open-sided shape.

The ring 12 is configured to have a press fitting portion 12*a* in a nearly cylindrical shape, and a reducing portion 12*b* extended from the press fitting portion 12*a* into the case 3. The outer diameter of the press fitting portion 12*a* is formed nearly equal to the inner diameter of the case 3, and the press fitting portion 12*a* is press fitted into the case 3. In addition, the reducing portion 12*b* is formed to have a diameter smaller than that of the press fitting portion 12*a*, and arranged to have a clearance 12*d* between it and the inner side surface of the case 3. On a part of the outer side surface 12*c* of the reducing portion 12*b*, two step portions 12*e* and 12*f* in a nearly flat surface are formed. The two step portions 12*e* and 12*f* are formed nearly symmetrically to the center axis C12 of the ring 12, and nearly in parallel with two surfaces on which the first excitation electrode 8 and the second excitation electrode 9 of the piezoelectric vibrating piece 2 are formed.

In addition, the ring 12 is formed of a conductive material. Preferably, this conductive material is a material having a thermal expansion coefficient almost similar to that of glass to form the filler 14. For example, an iron-nickel-cobalt alloy or an iron-nickel alloy is preferably used. Then, the step portion 12*e* on the bump connecting portion (stair portion) 15*a* side in the two step portions 12*e* and 12*f* of the ring 12 is wire bonded to the second excitation electrode 9 of the piezoelectric vibrating piece 2 with a wire 17, and they are electrically connected to each other. In addition, in the embodiment, two wires 17 are provided.

The case 3 is formed of a conductive material in a nearly cylindrical shape with a bottom, having the opening 3*a* on one end side, and the bottom part 3*b* on the other end side. Into the opening 3*a* of the case 3, the ring 12 of the hermetic terminal 4 is press fitted, whereby the inside of the case 3 is hermetically sealed in the vacuum state.

In addition, the bottom part 3*b* of the case 3 is formed with a second outer lead portion 18 projecting outside. In this configuration, the piezoelectric oscillator 1 according to the embodiment can conduct to the first excitation electrode 8 of the piezoelectric vibrating piece 2 from outside the case 3 through the lead 13 with the first outer lead portion 16 as well as to the second excitation electrode 9 of the piezoelectric vibrating piece 2 from outside through the case 3, the ring 12 and the wire 17 with the second outer lead portion 18. In addition, gold plating (not shown) is partially applied to the portion in which the wire 17 is joined to the step portion 12*e* of the ring 12 of the hermetic terminal 4 and the bump connecting portion 15*a* of the inner lead portion 15, which allows excellent conductivity. This gold plating is deposited in a film thickness of about a few angstroms in the step portion 12*e* and the bump connecting portion 15*a*.

Next, a method of fabricating the piezoelectric oscillator 1 will be described.

Figure 4:
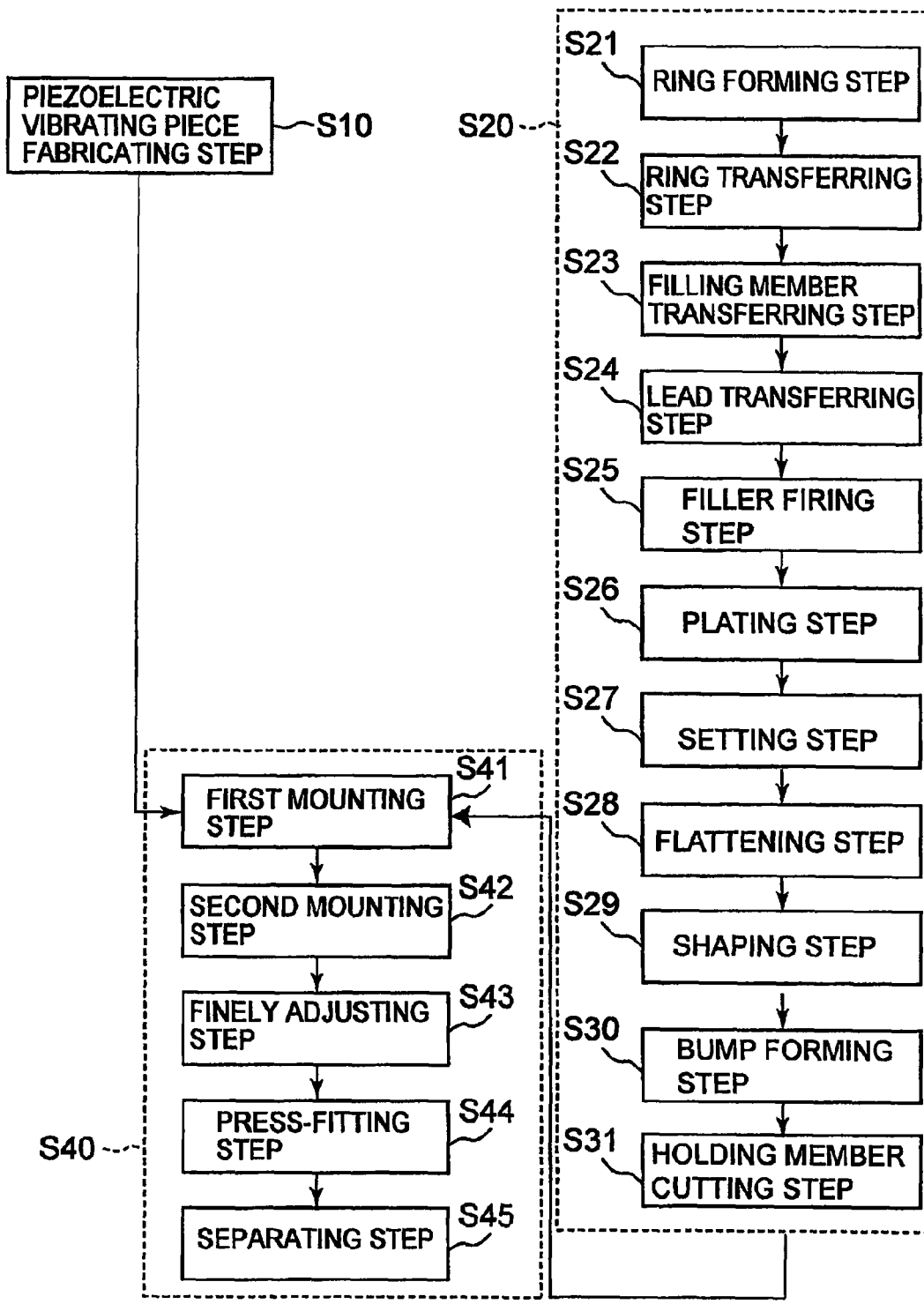
FIG. 4 shows a flow chart depicting the fabrication process steps of the piezoelectric oscillator according to the first embodiment of the invention.

FIG. 4 shows a flow chart depicting the fabrication process steps of the piezoelectric oscillator 1 according to the embodiment, and FIGS. 5 to 24 each show an illustration depicting the individual fabrication process steps. The fabrication process steps of the piezoelectric oscillator 1 according to the embodiment are roughly divided into a piezoelectric vibrating piece producing process step S10 in which the piezoelectric vibrating piece is produced, a hermetic terminal fabricating process step S20 in which the hermetic terminal 4 is fabricated, and an assembly process step S40 in which the piezoelectric vibrating piece 2, the hermetic terminal 4, and the case 3 are assembled. Hereinafter, the individual steps will be described in detail.

Figure 5:
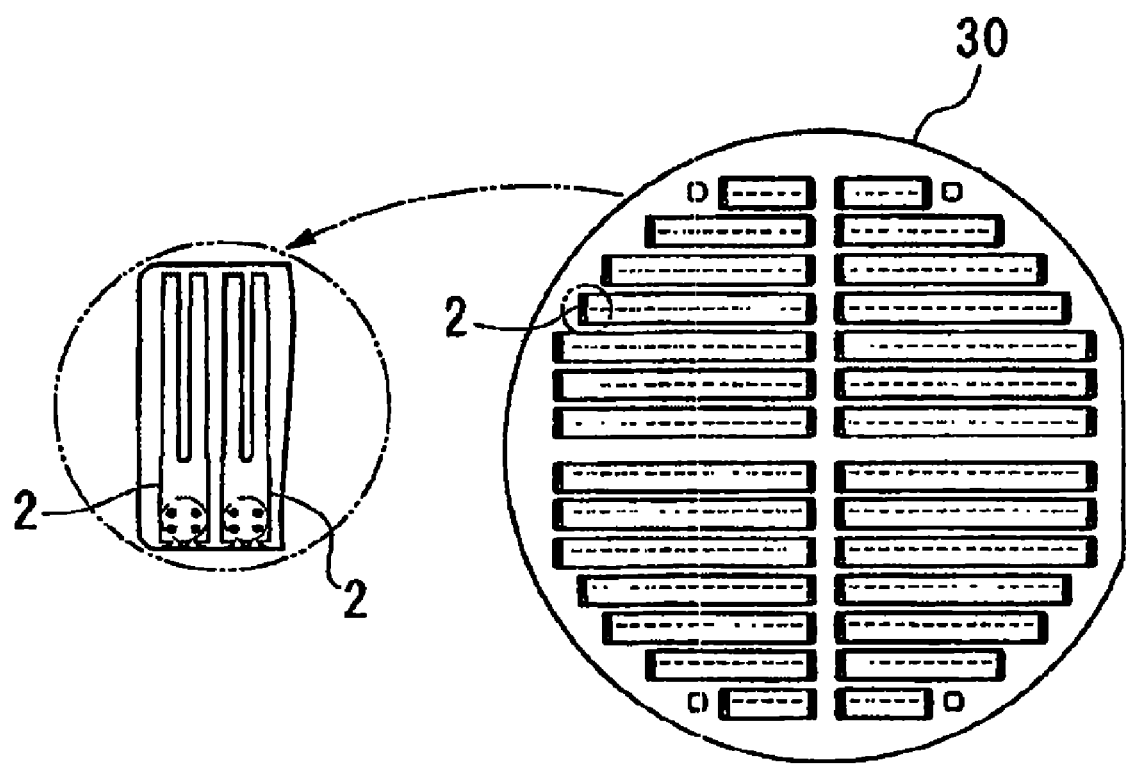
FIG. 5 shows an illustration depicting a piezoelectric oscillator producing process step in the fabrication process steps of the piezoelectric oscillator according to the first embodiment of the invention.

In the piezoelectric vibrating piece producing process step S10, first, a Lumbered rough stone quartz crystal is sliced to prepare a wafer having a predetermined thickness, and the wafer is polished to a certain thickness. Then, the outer shape of the quartz crystal piece 2*a* is patterned and etched on the wafer by photolithography, whereby a plurality of the quartz crystal pieces 2*a* (see FIGS. 1 and 2) can be prepared from the wafer. Subsequently, on each of the prepared quartz crystal pieces 2*a*, metal films are deposited for the first excitation electrode 8, the second excitation electrode 9, the fine tuning part 10, and the coarse tuning part 11. Then, for each of the quartz crystal pieces 2*a*, a laser beam is applied to the coarse tuning part 11 to partially evaporate the metal film forming the coarse tuning part 11 to change the weight, whereby the resonance frequency of the quartz crystal piece 2*a* is coarsely tuned, and then the piezoelectric vibrating piece 2 is completed. In addition, fine tuning in which the resonance frequency of the quartz crystal piece 2*a* is tuned more highly accurately is performed after assembled with the hermetic terminal 4. Then, as shown in FIG. 5, a plurality of the piezoelectric vibrating pieces 2 thus prepared is arranged on a dedicated palette 30, and carried to the assembly process step S40, described later.

Figure 6A:
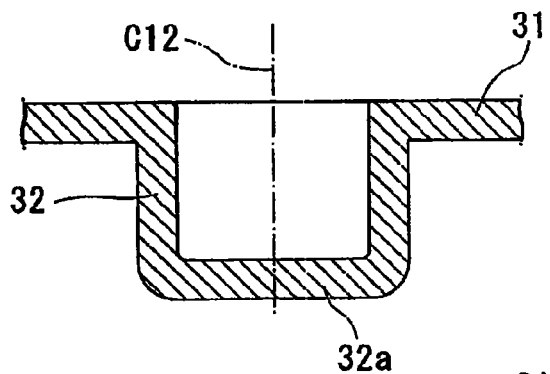
FIGS. 6A to 6D each show an illustration depicting a ring forming step in the fabrication process steps of the piezoelectric oscillator according to the first embodiment of the invention.

Next, the hermetic terminal fabricating process step S20, which is an embodiment of the method of fabricating a hermetic terminal according to the invention, will be described. In the hermetic terminal fabricating process step S20, first, the ring 12 is prepared as a ring forming step S21. In other words, as shown in FIG. 6A, a lance process is applied to a conductive plate member 31 such as an iron-nickel-cobalt alloy or an iron-nickel alloy for forming the ring 12, and then deep drawing is applied a plurality of times, whereby a cylinder member 32 is formed which has a bottom having the diameter nearly equal to the outer diameter of the press fitting portion 12*a* of the ring 12. In addition, the work position at which the cylinder member 32 is formed is accurately positioned by a pilot hole, not shown, formed in advance on the plate member 31, whereby a plurality of the cylinder members 32 can be arranged and formed.

Figure 6B:
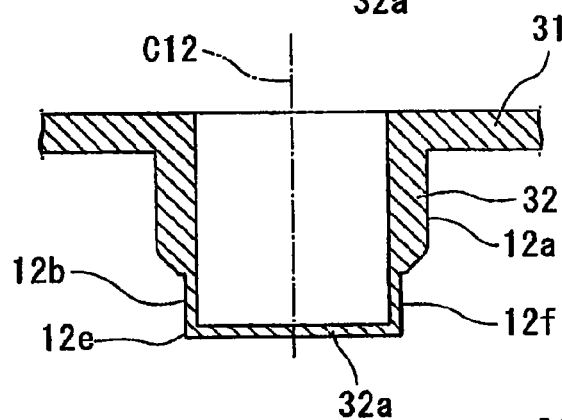
Figure 6C:
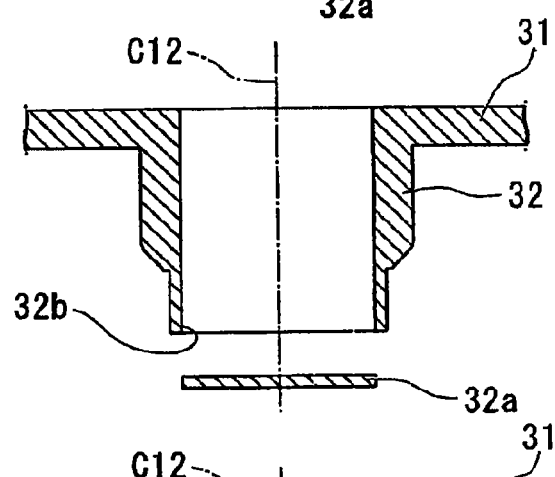
Figure 6D:
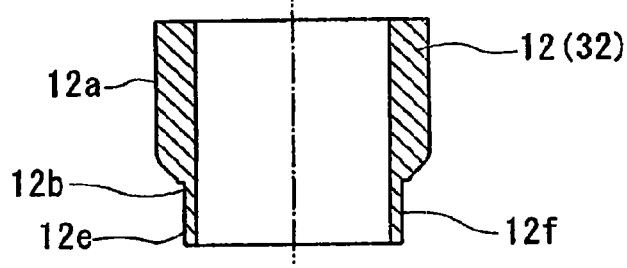

Subsequently, as shown in FIG. 6B, sizing is performed to form the reducing portion 12*b* and the two step portions 12*e* and 12*f*. In other words, the cylinder member 32 is molded in such a way that the portion to be the reducing portion 12*b* is further compressed to reduce the outer diameter thereof, and the portions to be the two step portions 12*e* and 12*f* are flat. Here, the two step portions 12*e* and 12*f* are formed nearly symmetrically to the center axis C12, whereby the reducing portion 12*b* can be formed in a uniform and nearly cylindrical shape without deforming the overall form. Then, as shown in FIG. 6C, a bottom part 32a of each of the cylinder members 32 is punched to form a ceiling hole 32b. Lastly, as shown in FIG. 6D, blanking is performed to remove the cylinder member 32 from the plate member 31 for completing the ring 12.

Figure 7:
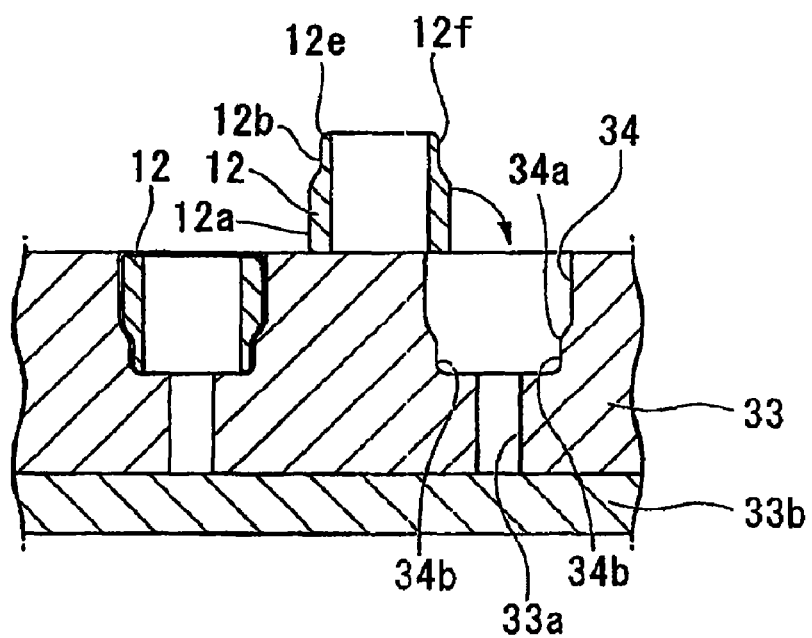
FIG. 7 shows an illustration depicting a ring loading step in the fabrication process steps of the piezoelectric oscillator according to the first embodiment of the invention.

Subsequently, the ring 12, the bar-shaped member to be the lead 13, and the filler 14 are joined to each other. In other words, first, as a ring loading step S22, as shown in FIG. 7, a plurality of the rings 12 is mounted on a ring carbon jig 33 having a plurality of recessed parts 34. The ring carbon jig 33 is formed of carbon so that it can be used in firing the filler 14 in a filler firing step S25, described later, which is a firing jig according to the invention. In addition, on the bottom side of the recessed part 34, the recessed part 34 has a reducing portion 34a corresponding to the reducing portion 12b of the ring 12 and a flat portion 34b corresponding to the two step portions 12e and 12f of the ring 12 so that the ring 12 can be inserted downward. The orientation of each of the flat portions 34b of the plurality of the recessed parts 34 is formed to be nearly equal to each other. In addition, on the bottom surface side of the recessed part 34, an insertion hole 33a is formed, into which the bar-shaped member can be inserted coaxially to the recessed part 34. The depth of the insertion hole 33a is formed so that it can be matched with the length of the bar-shaped member to be the inner lead portion 15 of the lead 13 (on one end side thereof), and the bottom part side thereof is blocked with a bottom plate 33b.

A plurality of the rings 12 is placed on the top of the ring carbon jig 33 in this configuration, and vibrations are applied to the ring carbon jig 33 to load the plurality of the rings 12 each into the recessed part 34 as the orientation is aligned. At this time, since the ring 12 is formed as the two step portions 12e and 12f are nearly symmetrically to the center axis C12 and the ring 12 is formed in a nearly symmetric member overall, the ring 12 can be more smoothly loaded by vibrations.

Figure 8:
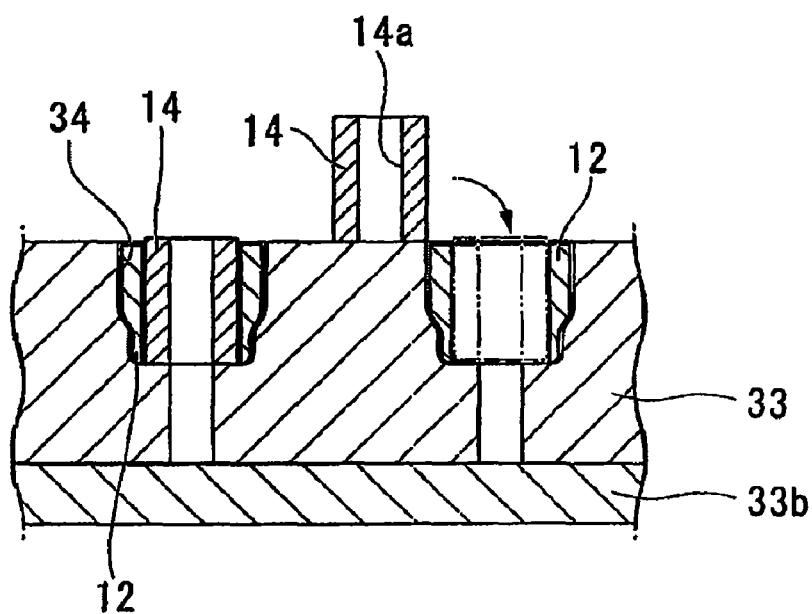
FIG. 8 shows an illustration depicting a filler inserting step in the fabrication process steps of the piezoelectric oscillator according to the first embodiment of the invention.

Subsequently, as a filler inserting step S23, as shown in FIG. 8, the filler 14 is inserted into each of the rings 12 loaded in the recessed part 34 of the ring carbon jig 33. Since the filler 14 has a shape before fired in the filler firing step S25, described later, the filler 14 has the outer diameter that the filler 14 can be inserted into the ring 12 as well as a shape having the through hole 14a into which the bar-shaped member can be inserted. Then, a plurality of the fillers 14 is placed on the top of the ring carbon jig 33 to apply vibrations to the ring carbon jig 33, whereby each of the fillers 14 is inserted into the ring 12.

Figure 9:
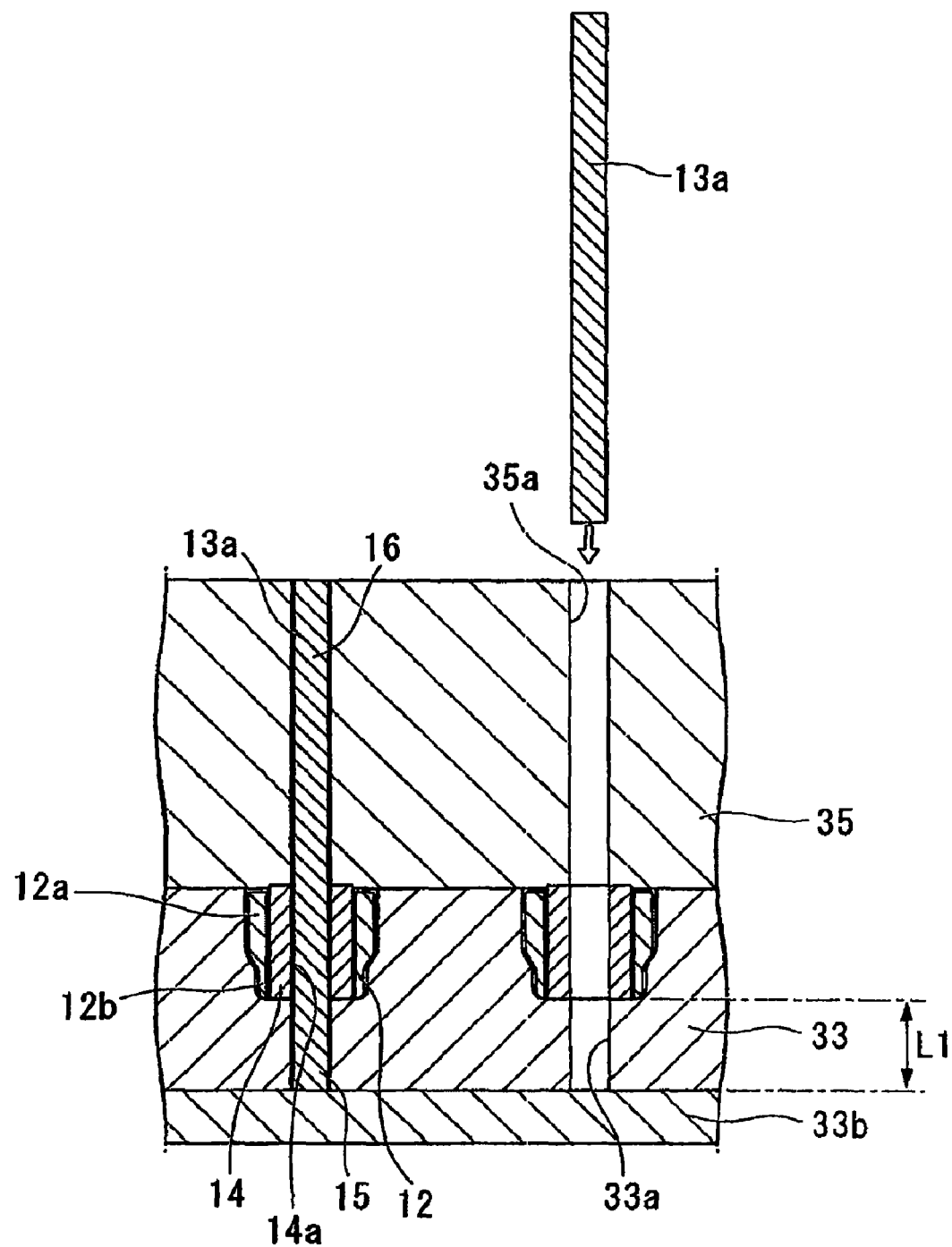
FIG. 9 shows an illustration depicting a lead inserting step in the fabrication process steps of the piezoelectric oscillator according to the first embodiment of the invention.

Subsequently, as a lead inserting step S24, as shown in FIG. 9, the bar-shaped member 13a is inserted into the through hole 14a of the filler 14 that is inserted into the ring 12. Here, as described above, the bar-shaped member 13a is a solid round bar to be the lead 13 in the hermetic terminal 4 as a completed product, in which the length thereof is formed longer than the length of the lead 13.

In order to insert the bar-shaped member 13a like this into the through hole 14a of the filler 14, first, on the top of the ring carbon jig 33 in which the rings 12 and the fillers 14 are loaded, a lead carbon jig 35 is set which is a firing jig according to the invention. The lead carbon jig 35 is formed with a plurality of through holes 35a into which the bar-shaped member 13a can be inserted. In addition, the ring carbon jig 33 and the lead carbon jig 35 have a positioning pin (not shown) and a positioning hole (not shown) at positions corresponding to each other, whereby the recessed part 34 is coaxially arranged and inserted into the through hole 35a in the state in which they are joined to each other.

Then, a plurality of the bar-shaped members 13a is placed on the top of the lead carbon jig 35 to apply vibrations to the ring carbon jig 33 and the lead carbon jig 35, and then each of the bar-shaped members 13a is inserted into the through hole 14a of the filler 14 that is inserted into the ring 12. Thus, each of the bar-shaped members 13a is joined to (put together with) the ring 12 and the filler 14 in the state in which the portion to be the inner lead portion 15 (one end side) is extended under the ring 12, and the portion to be the first outer lead portion 16 (other end side) is extended above the ring 12.

Here, the bar-shaped member 13a is inserted into the ring 12 in such a way that one end side of the bar-shaped member 13a to be inserted into the insertion hole 33a of the ring carbon jig 33 has the length, that is, the length corresponding to the insertion hole 33a denoted by L1 in FIG. 9, longer than the length of the inner lead portion 15 in the hermetic terminal 4 as a completed product, that is, the length denoted by L2 in FIG. 2, and then the bar-shaped member 13a is joined to the ring 12 and the filler 14. In other words, the ring carbon jig 33 is formed to have the length L1 of the insertion hole 33a longer than the length L2 of the inner lead portion 15, and the bar-shaped member 13a is inserted into the ring carbon jig 33 to the length L1 of the insertion hole 33a.

Here, preferably, the length L1 of one end side of the bar-shaped member 13a corresponding to the length of the insertion hole 33a ranges from 1.5 times to 3 times the length L2 of the inner lead portion 15 because of the reason below, described later; it is about two times in the embodiment. In addition, in the embodiment, the length of the bar-shaped member 13a is set to the other end projecting above the ring 12, that is, the portion to be the first outer lead portion 16 in such a way that the length is nearly matched with the length of the first outer lead portion 16 in the hermetic terminal 4 as a completed product.

In addition, in the invention, the ring loading step S22, the filler inserting step S23, and the lead inserting step S24 are combined into a joining step in which the bar-shaped member 13a to be the lead 13 is inserted into the ring 12 through the filler 14.

Figure 10:
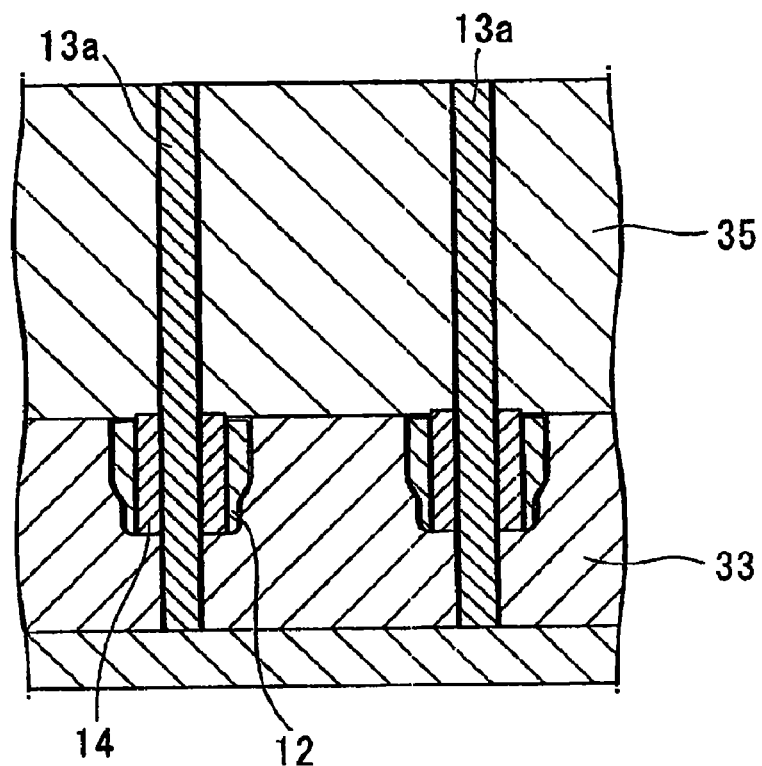
FIG. 10 shows an illustration depicting a filler firing step in the fabrication process steps of the piezoelectric oscillator according to the first embodiment of the invention.
Figure 11:
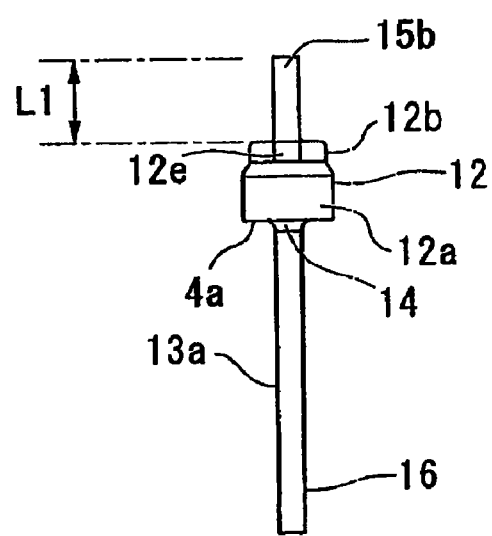
FIG. 11 shows a schematic diagram depicting a hermetic terminal intermediate prepared in a hermetic terminal fabricating process step in the fabrication process steps of the piezoelectric oscillator according to the first embodiment of the invention.

Subsequently, as the filler firing step S25, the filler 14 is fired as it is joined to the ring 12 and the bar-shaped member 13a. In other words, as shown in FIG. 10, the ring carbon jig 33 and the lead carbon jig 35 are placed in the heating furnace as the ring 12, the bar-shaped member 13a and the filler 14 are inserted therein, and they are heated at a temperature of 980° C. for about 13 hours, for example. Thus, the filler 14 is fired to hermetically seal the ring 12 to the bar-shaped member 13a, and then, the ring 12, the bar-shaped member 13a and the filler 14 are formed in one piece. Therefore, as shown in FIG. 11, the hermetic terminal intermediate 4a is formed. In the hermetic terminal intermediate 4a thus obtained, the length of one end side (inner lead portion) 15b of the bar-shaped member 13a is L1 as discussed above, and is longer than the length L2 of the inner lead portion 15 in the hermetic terminal 4 as a completed product.

Here, the hermetic terminal intermediate 4a uses the bar-shaped member 13a longer than the lead 12, the one end side 15b to be the inner lead portion of the bar-shaped member 13a is inserted into the ring 12 so that the one end side 15b is longer than the inner lead portion 15, and the hermetic terminal intermediate 4a is accommodated and fired in the ring carbon jig 33 and the lead carbon jig 35, which are the firing jig. Thus, it is prevented that the one end side 15b extended from the ring 12 to be the inner lead portion becomes extremely shorter than the other end side to be the first outer lead portion in the firing jig. Therefore, as compared with the case in which the one end side 15b to be the inner lead portion is formed to have the same length as that of the inner lead portion 15 in the hermetic terminal 4 as a completed product, the one end side 15b and the other end side of the bar-shaped member 13a are extended relatively in good balance with respect to the ring 12. Therefore, the degree that the bar-shaped member 13a is inclined to the center axis of the ring 12 is made smaller, whereby the bar-shaped member 13a is prevented from being eccentric to the ring 12.

In addition, the filler firing step S25 and the joining step configure a joining and firing step according to the invention.

Figure 12:
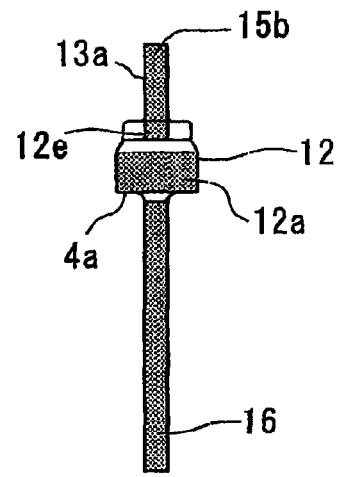
FIG. 12 shows an illustration depicting a plating step in the fabrication process steps of the piezoelectric oscillator according to the first embodiment of the invention.

Subsequently, the hermetic terminal intermediate 4a is removed from the ring carbon jig 33 and the lead carbon jig 35, and subjected to a plating step S26. In other words, as shown in FIG. 12, as the plating step S26, plating is applied to the outer side surface of the press fitting portion 12a and a part of the step portion 12e of the ring 12 and the bar-shaped member 13a in each of the hermetic terminal intermediate 4a.

For example, the plating process includes base plating and finish plating, and for base plating, copper plating is used, for example. In addition, for finish plating, for example, a tin-copper alloy plating or gold plating is used, and particularly, gold plating is preferably used. In the ring 12, the step portion 12e is a connecting portion for wire bonding, and one end side of the bar-shaped member 13a is the bump connecting portion 15a as described later. Thus, as finish plating, gold plating with more excellent connecting properties is preferable.

In addition, prior to such plating process, as pre-processing of plating, preferably, the surfaces of the bar-shaped member 13a and the ring 12 are cleaned, degreased with an alkaline solution, and acid washed with solutions of hydrochloric acid and sulfuric acid.

In addition, after the plating process, in order to stabilize the formed plating film (metal film), preferably, the plating film is annealed in a furnace in a vacuum atmosphere at a temperature of 170° C. for about one hour, for example. Thus, residual stress in the plating film can be removed.

Figure 13A:
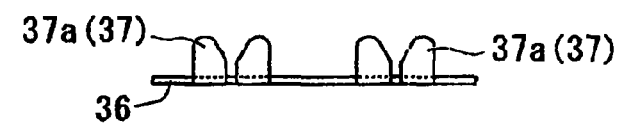
FIGS. 13A and 13B each show a schematic diagram depicting holding members in the fabrication process steps of the piezoelectric oscillator according to the first embodiment of the invention.
Figure 13B:
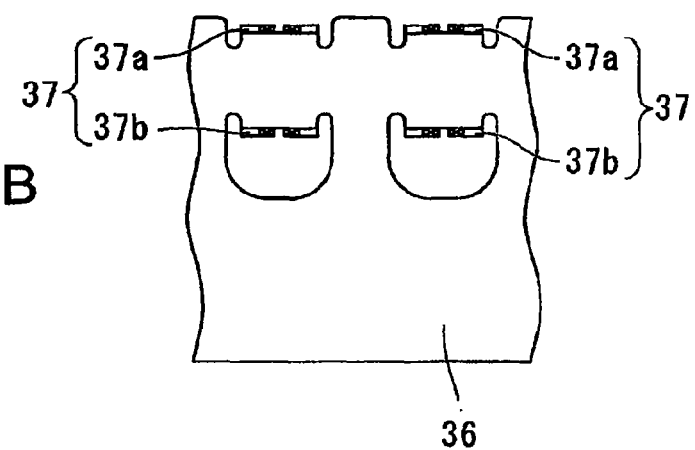

Subsequently, as a setting step S27, the hermetic terminal intermediate 4a after plated is arranged and set on a holding member 36. FIGS. 13A and 13B each show the holding member 36 before the hermetic terminal intermediates 4a are set thereon, and FIGS. 14A and 14B each show the holding member 36 after the hermetic terminal intermediates 4a are set thereon. Although not shown in FIGS. 13A to 14B, the holding member 36 is a long resin product continued in a belt shape, on which a large number of hermetic terminal arranging parts 37 are formed at equal intervals in the length direction. The hermetic terminal arranging part 37 is configured of a pair of retaining parts 37a and 37b. As shown in FIGS. 14A and 14B, the retaining parts 37a and 37b are configured to retain the first outer lead portion (other end side) 16 of the bar-shaped member 13a in each of the hermetic terminal intermediates 4a.

In the setting step S27, as shown in FIGS. 14A and 14B, on the holding member 36 thus configured, the first outer lead portion (other end side) 16 of each of the hermetic terminal intermediates 4a formed in the previous step is retained on each of the hermetic terminal arranging parts 37 of the holding member 36. At this time, the one end side 15b to be the inner lead portion 15 and the ring 12 are positioned outside the holding member 36, and continuously arranged in the length direction of the holding member 36. At this time, in the embodiment, since the setting step S27 is performed prior to the flattening step, described later, it is unnecessary to align the orientation of the stair portion formed in the flattening step in one direction (upward) as the techniques before. Therefore, the hermetic terminal intermediate 4a can be easily set on the holding member 36.

In addition, since the two step portions 12e and 12f of the ring 12 in the hermetic terminal intermediate 4a are formed nearly symmetrically to each other to the center axis C12, even though any one of the two step portions 12e and 12f is selected and placed as it is directed upward, wire bonding can be performed under the same conditions in a second mounting step S42, described later. In other words, since a plurality of the step portions is provided, in arranging the hermetic terminal intermediates 4a, any one of the step portions to be the position for wire bonding later can be readily adjusted upward.

Figure 16A:
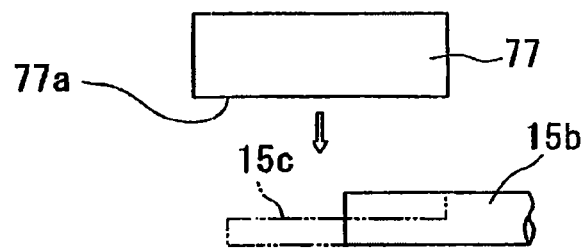
FIGS. 16A, 16B, and 16C each show an illustration depicting a flattening step in the fabrication process steps of the piezoelectric oscillator according to the first embodiment of the invention.
Figure 16B:
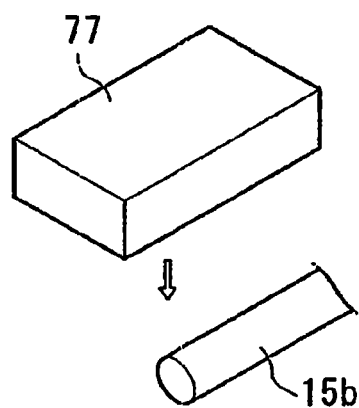
Figure 16C:
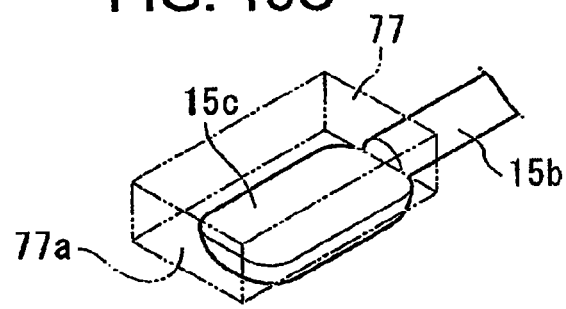

Subsequently, as a flattening step S28, the one end side 15b of the bar-shaped member 13a of each of the hermetic terminal intermediates 4a is flattened, and a stair portion 15c is formed on one side of the one end side 15b (the side to be flattened) in the bar-shaped member 13a as shown in FIGS. 15A and 15B. In other words, while the holding member 36 is being moved intermittently, the tip end portion of the one end side 15b of each of the hermetic terminal intermediates 4a extended outside the holding member 36 is in turn flattened from above with a die 77 as shown in FIGS. 16A to 16C, and a nearly half of the round bar shaped bar-shaped member 13a is made flat as shown in FIG. 16C.

Here, in the invention, since the one end side 15b of the bar-shaped member 13a is inserted into the ring 12 in such a way that the one end side 15b is longer than the inner lead portion 15 in the hermetic terminal 4 as a completed product, the stair portion 15c formed by being flattened can be formed to have a relatively large area. In other words, the stair portion 15c is formed in such away that the length of the portion not to be the stair portion 15c in the one end side 15b is the same length as that of the corresponding portion in the hermetic terminal 4 as a completed product, whereby the a relatively longer range for flattening can be surely provided, which allows the stair portion 15c to be formed to have a relatively large area.

On the die 77 as a flattening tool, Ti—Cr is deposited in advance by an electro-deposition method to provide a Ti—Cr film having a thickness of about 1 μm at least on a flattening surface 77a. Since the Ti—Cr film is hard with excellent durability, this hard film is provided on the flattening surface to form the flattening surface 77a into a smooth surface with no projections and depressions as well as to maintain the smoothness for a long time. Therefore, as described above, the flattening surface 77a is used to flatten the one end side 15b of the hermetic terminal intermediate 4a after plated, and no damage occurs in the plated surface of the stair portion 15c formed by being flattened because the flattening surface 77a is smooth. Thus, such a problem can be prevented that a plating is removed and transferred to the flattening surface 77a side.

In addition, the flattening step S28 is performed after the filler firing step S25 as in the embodiment, whereby it is unnecessary to adjust the relative orientations between the two step portions 12e and 12f of the ring 12 and the bump connecting portion 15a of the bar-shaped member 13a in the lead inserting step S24 and the filler firing step S25.

Figure 17:
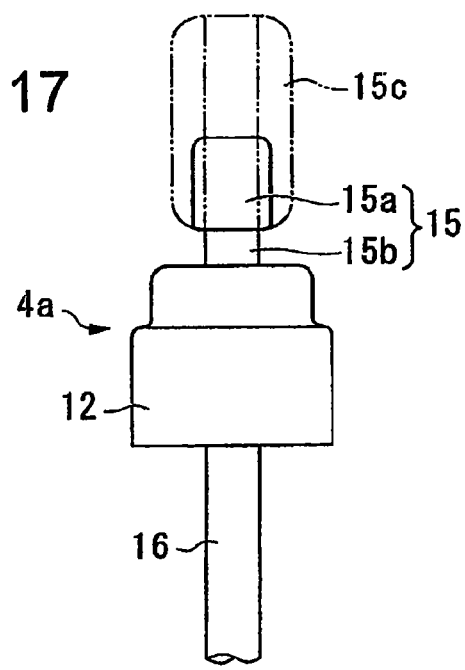
FIG. 17 shows an illustration depicting a shaping step in the fabrication process steps of the piezoelectric oscillator according to the first embodiment of the invention.

Subsequently, as a shaping step S29, as indicated by chain double-dashed lines in FIG. 17, the tip end part and the two side parts of the stair portion 15c formed in the flattening step S28 are cut with a cutting die (not shown), for example, the stair portion 15c is shaped into a nearly rectangle, for example, as depicted by a solid line in FIG. 17, and then the bump connecting portion 15a is formed substantially rectangularly. Thus, the one end side 15b of the bar-shaped member 13a becomes the inner lead portion 15. As described above, since the stair portion 15c after flattened is partially cut into a predetermined shape, the bump connecting portion 15a obtained has a uniform shape and dimensions as designed.

Here, the margin for partially cutting the stair portion 15c to shape it into a predetermined shape is secured because the stair portion 15c is formed to have a relatively large area as described above.

Figure 18:
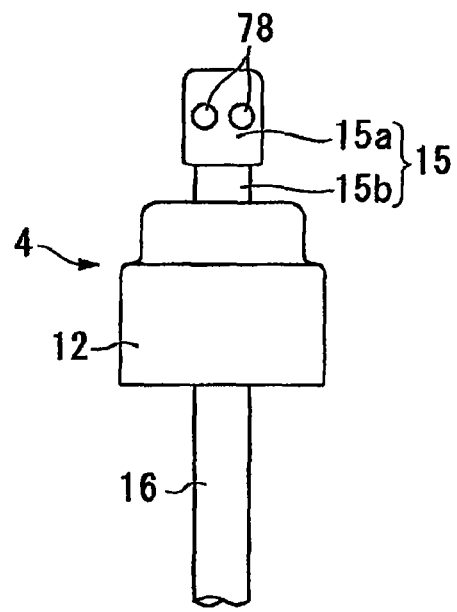
FIG. 18 shows an illustration depicting a bump forming step in the fabrication process steps of the piezoelectric oscillator according to the first embodiment of the invention.

Subsequently, as a bump forming step S30, as shown in FIG. 18, a pair of gold bumps 78 is formed at a predetermined position on the bump connecting portion 15a, and then the hermetic terminal 4 as a completed product is obtained. For example, for the position of forming the gold bump 78, based on the top edge and two side edges of the bump connecting portion 15a, a position apart from a predetermined distance from these edges is determined, and the gold bump 78 is formed at this position. Therefore, as described above, since the stair portion 15c is shaped into a predetermined rectangle, the position of forming the gold bump 78 is as designed, and variations are suppressed.

Figure 19:
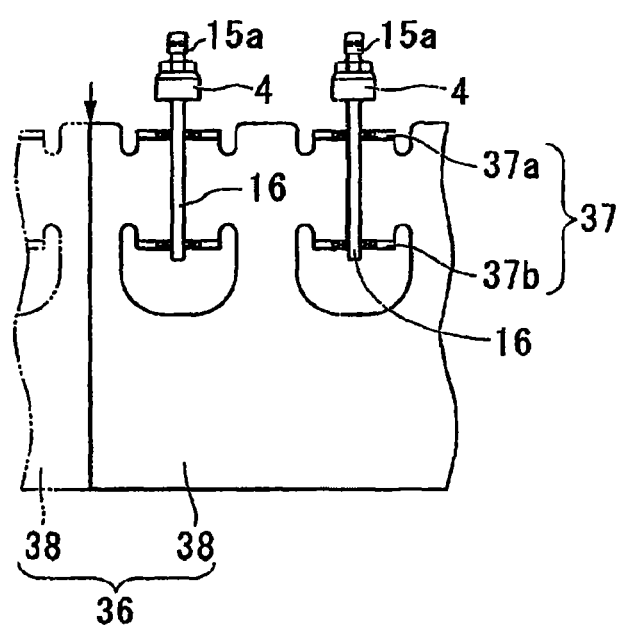
FIG. 19 shows an illustration depicting a holding member cutting step in the fabrication process steps of the piezoelectric oscillator according to the first embodiment of the invention.

Subsequently, as a holding member cutting step S31, as shown in FIG. 19, the holding member 36 in a belt shape is cut in every predetermined length. Thus, the holding member after cut is formed into a palette 38, and 24 terminals of formed hermetic terminals 4, for example are arranged and held on each of the palettes 38 in advance. Therefore, all the steps of the hermetic terminal fabricating process step S20 are finished.

Figure 20A:
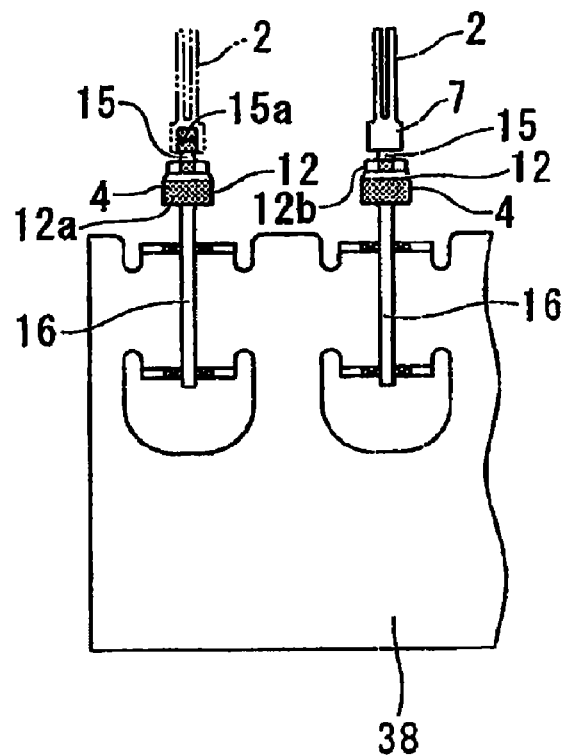
FIGS. 20A and 20B each show an illustration depicting a first mounting step in the fabrication process steps of the piezoelectric oscillator according to the first embodiment of the invention.
Figure 20B:
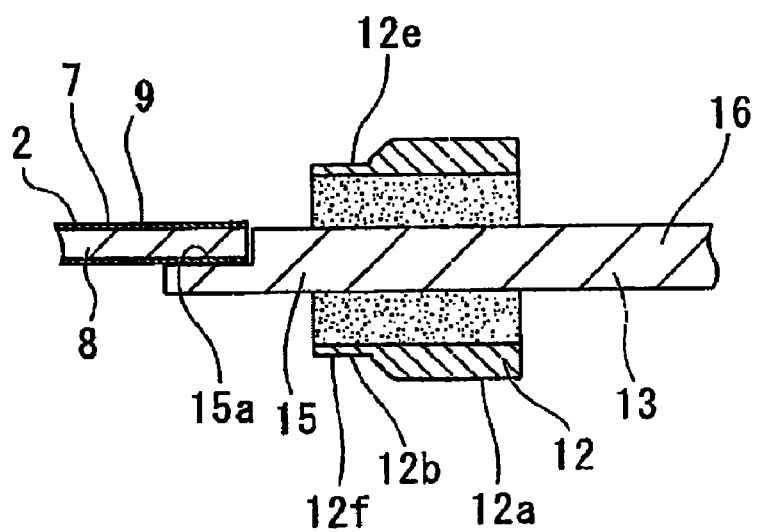

Subsequently, as the assembly process step S40, the piezoelectric vibrating piece 2, the case 3, and the hermetic terminal 4 are assembled. First, as a first mounting step S41, as shown in FIGS. 20A and 20B, on the palette 38, the piezoelectric vibrating piece 2 is mounted on the inner lead portion 15 of each of the hermetic terminals 4. In other words, the piezoelectric vibrating piece 2 prepared in the piezoelectric vibrating piece producing process step S10 is taken out of the dedicated palette 30. Then, the first excitation electrode 8 of the taken piezoelectric vibrating piece 2 is connected to the formed bump connecting portion 15a on which the gold bumps 78 (not shown in FIG. 20) are formed on the inner lead portion 15 of each of the hermetic terminals 4 through the bumps in the base portion 7. At this time, it is the same as the techniques before that the gold bump 78 is used as the alignment mark for positioning. For the conditions of bump connection, for example, the mounting temperature is 130° C., the bonding load is 0.5 N, and the load time is about $15 \times 10^{-3}$ seconds. Thus, the first excitation electrode of the piezoelectric vibrating piece 2 is electrically connected to the lead 13, and the piezoelectric vibrating piece 2 is supported by the inner lead portion 15 of the lead 13 in an open-sided shape.

Here, as described above, since the gold bumps 78 are highly accurately arranged on the bump connecting portion 15a as designed, the piezoelectric vibrating piece 2 positioned relative to the bumps is also highly accurately connected to the position as designed.

In addition, since the bump connecting portion 15a is formed nearly flat in the flattening step, the conductivity between the first excitation electrode 8 and the lead 13 can be made more reliable as well as the piezoelectric vibrating piece 2 can be supported excellently by the lead 13. In addition, since the bump connecting portion 15a is flattened to the position almost the same as the center axis of the lead 13, the piezoelectric vibrating piece 2 can be connected to the lead 13 at the position almost the same as the center axis of the lead 13.

Figure 21A:
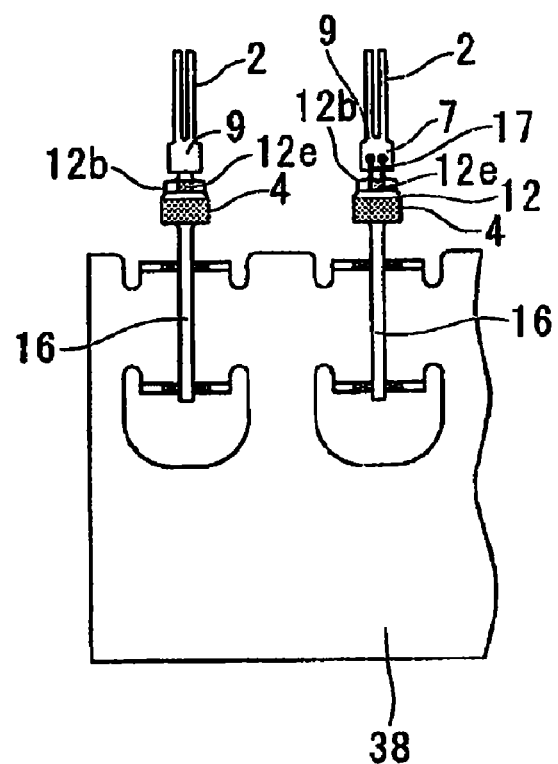
FIGS. 21A and 21B each show an illustration depicting a second mounting step in the fabrication process steps of the piezoelectric oscillator according to the first embodiment of the invention.
Figure 21B:
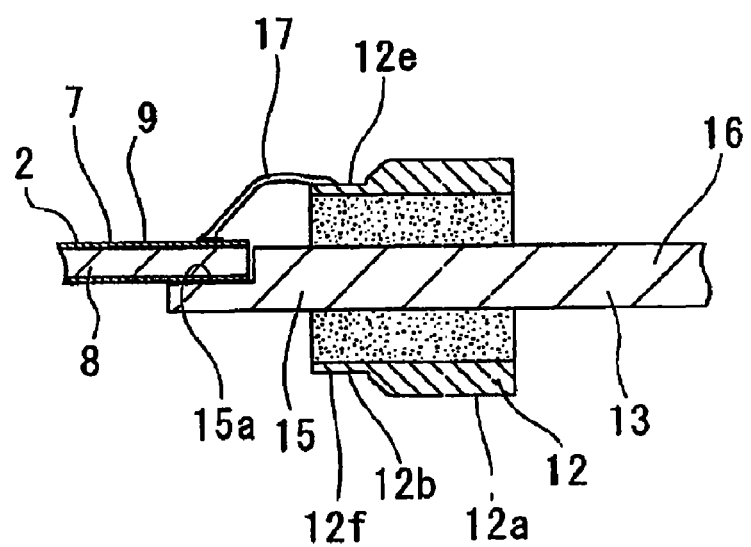

Subsequently, as a second mounting step S42, as shown in FIGS. 21A and 21B, the step portion 12e selected from the two step portions 12e and 12f of the ring 12 in each of the hermetic terminals 4 is wire bonded to the second excitation electrode 9 of the piezoelectric vibrating piece 2 mounted on each of the hermetic terminals 4. In the embodiment, two wires 17 are bonded between the step portion 12e and the second excitation electrode 9. For the wire 17 for use, for example, a gold (Au) line is selected, one end of the wire 17 is bonded to the second excitation electrode 9 in the base portion 7 of the piezoelectric vibrating piece 2, and then the other end is bonded to the step portion 12e of the ring 12. For the individual conditions for wire bonding, for example, the mounting temperature is 130° C., the wire diameter is 25 μm, the ball diameter is 80 to 85 μm, the ball thickness if 13 μm, and the shear strength is from 0.45 to 0.53 N; the bonding load is 0.55 N in bonding to the second excitation electrode 9, and the load time is $7 \times 10^{-3}$ seconds; and the bonding load is 0.4 N, and the load time is about $5 \times 10^{-3}$ seconds in bonding to the step portion 12e. Thus, the second excitation electrode 9 of the piezoelectric vibrating piece 2 is electrically connected to the ring 12. Here, in the outer side surface of the reducing portion 12b, the second excitation electrode 9 is bonded to the nearly flat step portion 12e, whereby conductivity can be ensured. Particularly, the second excitation electrode 9 is connected with a plurality of the wires 17, whereby conductivity can be more ensured. In addition, the filler 14 having the insulating properties is interposed between the lead 13 connected to the first excitation electrode 8 and the ring 12 connected to the second excitation electrode 9 to provide insulation therebetween, whereby the first excitation electrode 8 of the piezoelectric vibrating piece 2 is insulated from the second excitation electrode 9 to prevent short circuits.

Figure 22:
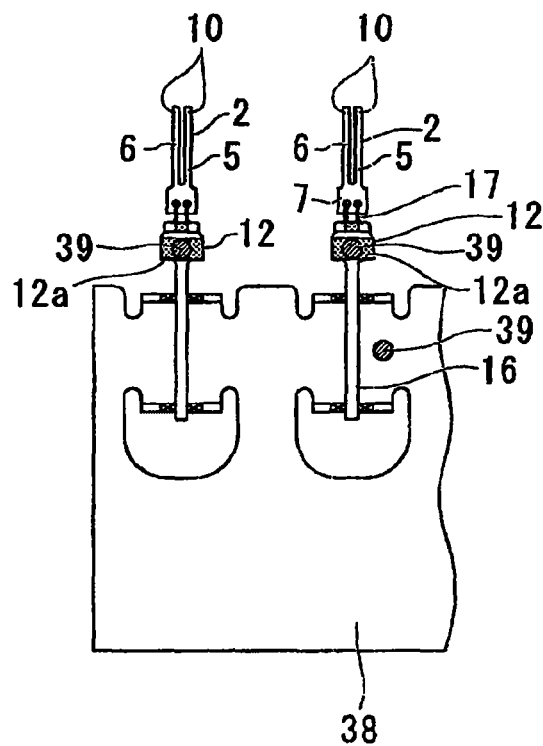
FIG. 22 shows an illustration depicting a fine tuning step in the fabrication process steps of the piezoelectric oscillator according to the first embodiment of the invention.

Subsequently, as a fine tuning step S43, the piezoelectric vibrating piece 2 is finely tuned. In other words, as shown in FIG. 22, in the vacuum atmosphere, an electrode is contacted with a contact 39 provided on the outer side surface of the press fitting portion 12a of the ring 12 and on the palette 38, and voltage is applied thereon, whereby the oscillating arm portions 5 and 6 of the piezoelectric vibrating piece 2 are oscillated. Then, the frequencies of the oscillating arm portions 5 and 6 are measured while a laser beam is applied onto the fine tuning part 10 to evaporate the metal film forming the fine tuning part 10, whereby the piezoelectric vibrating piece 2 is finely tuned so that the vibrations of the oscillating arm portions 5 and 6 of the piezoelectric vibrating piece 2 can be a predetermined resonance frequency.

Figure 23:
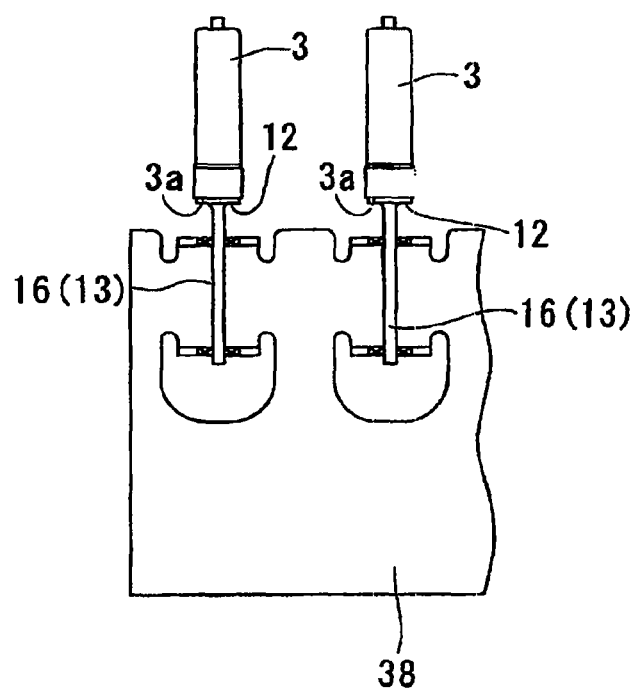
FIG. 23 shows an illustration depicting a press fitting step in the fabrication process steps of the piezoelectric oscillator according to the first embodiment of the invention
Figure 24:
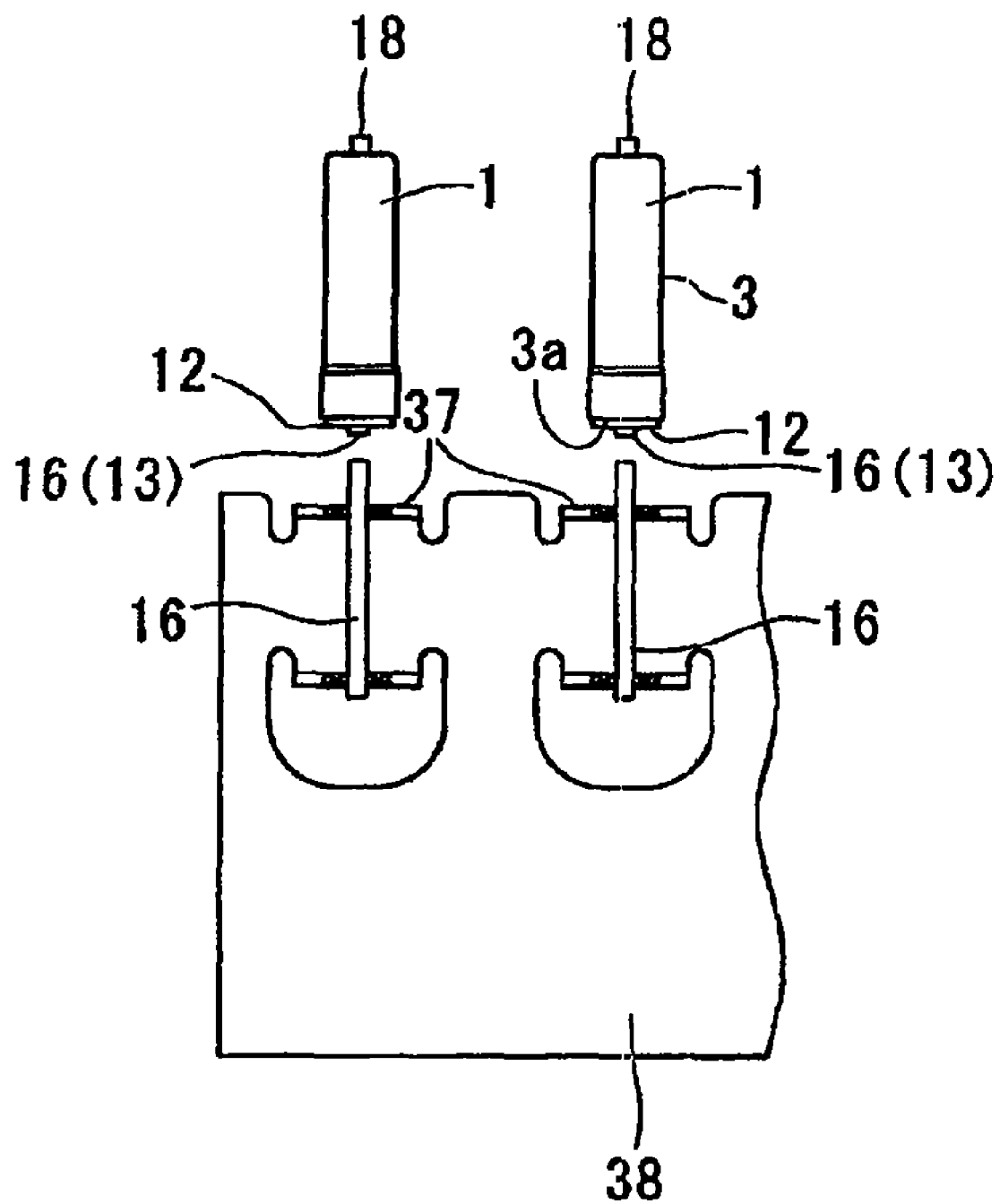
FIG. 24 shows an illustration depicting a separating step in the fabrication process steps of the piezoelectric oscillator according to the first embodiment of the invention.

Subsequently, as a press fitting step S44, as shown in FIG. 23, in the vacuum atmosphere, each of the piezoelectric vibrating pieces 2 is inserted from the opening 3a of the case 3 formed in a predetermined shape in advance, and the ring 12 of the hermetic terminal 4 is press fitted into the case 3, whereby the piezoelectric vibrating piece 2 is hermetically sealed in the case 3. Lastly, as a separating step S45, as shown in FIG. 24, in the first outer lead portion 16 of the lead 13, the portion fitted into the hermetic terminal arranging part 37 of the palette 38 is separated, and then the piezoelectric oscillator 1 is completed.

As described above, in the piezoelectric oscillator 1 according to in the embodiment, for the first excitation electrode 8 and the second excitation electrode 9 of the piezoelectric vibrating piece 2 arranged in the case 3, the first excitation electrode 8 can externally conduct through the first outer lead portion 16 of the lead 13, and the second excitation electrode 9 can externally conduct the second outer lead portion 18 of the case 3 through the ring 12 and the case 3 with no short circuits with each other. Here, the second excitation electrode 9 can be connected to the step portion 12e formed in the reducing portion 12b by providing the wire 17 with the use of the clearance 12d formed between the inner side surface of the case 3 and the step portion 12e of the ring 12, and the outer diameters of the case 3 and the ring 12 will not become larger. In addition, since the ring 12 has a simple structure including the press fitting portion 12a, the reducing portion 12b, and the two step portions 12e and 12f, even though the outer diameter thereof is reduced, the ring 12 can be readily formed by press working. On this account, in the piezoelectric oscillator 1 according to in the embodiment, the size can be reduced while short circuits can be prevented, and the piezoelectric oscillator 1 can be readily fabricated with excellent yields. In addition, the piezoelectric vibrating piece 2 is arranged at the position almost the same as the center axis of the lead 13 by the nearly flat bump connecting portion 15a, whereby the piezoelectric vibrating piece 2 can be arranged at the position almost the same as the center axis C3 of the case 3 together with the lead 13. Therefore, the distance between the inner side surface of the case 3 and the piezoelectric vibrating piece 2 can be set to the minimum length depending on the range in which the piezoelectric vibrating piece 2 is displaced, and thus the case 3 and the ring 12 can be further reduced in size.

In addition, since in the hermetic terminal 4, the lead 13 is prevented from being eccentric and high accuracy and enhanced reliability are provided to the connecting position of the piezoelectric vibrating piece 2, in the piezoelectric oscillator 1 formed by using the hermetic terminal 4, the size can be reduced and the reliability can be ensured.

Figure 30:
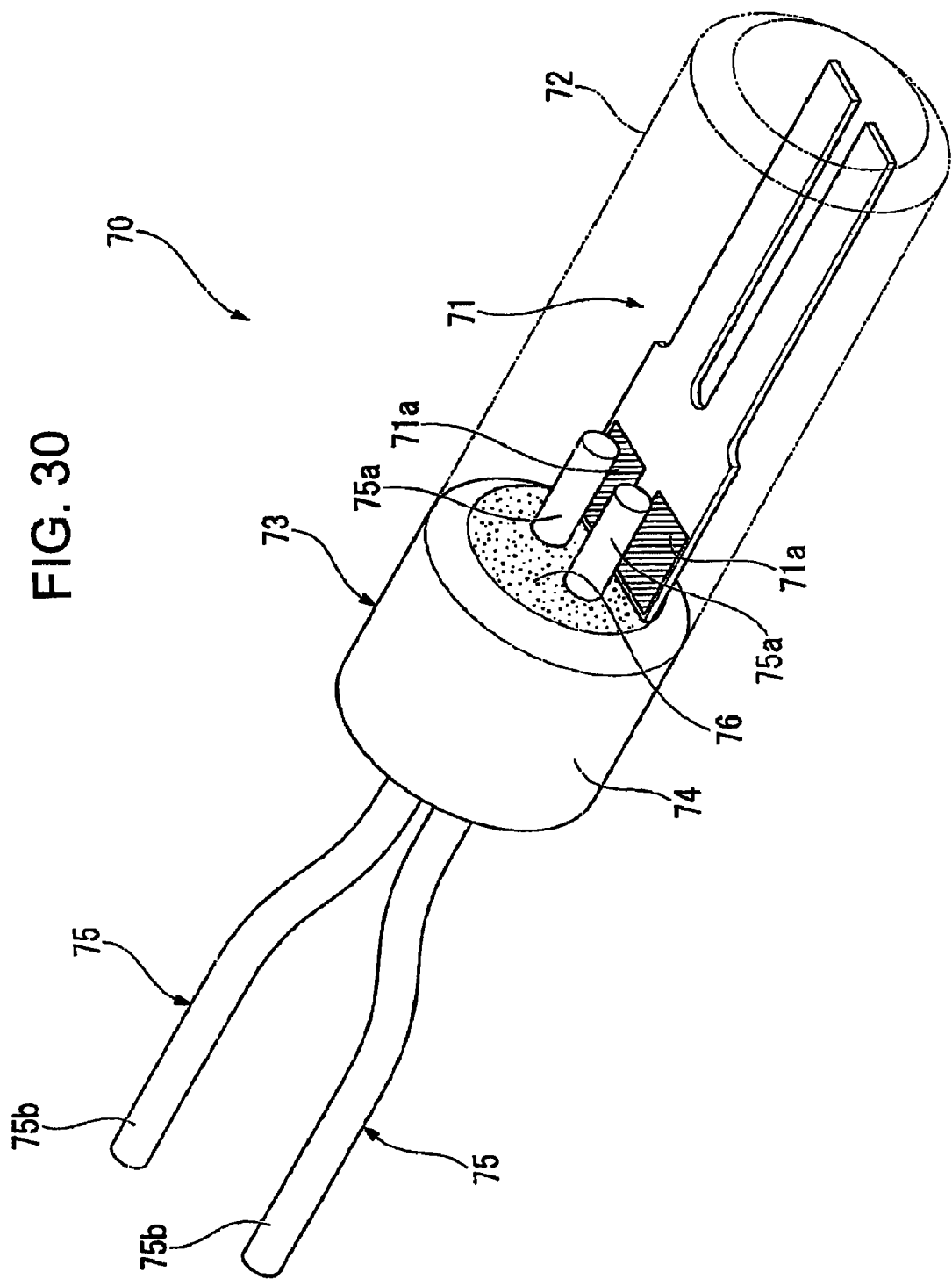
FIG. 30 shows a block diagram schematically depicting a piezoelectric oscillator before.

In addition, in the embodiment, the hermetic terminal 4 with a single lead 13 and the piezoelectric oscillator 1 using the same are described, but the invention is not limited thereto. The invention can be adapted to the hermetic terminal with two leads as the hermetic terminal 73 of the piezoelectric oscillator 70 shown in FIG. 30.

Second Embodiment

Figure 25:
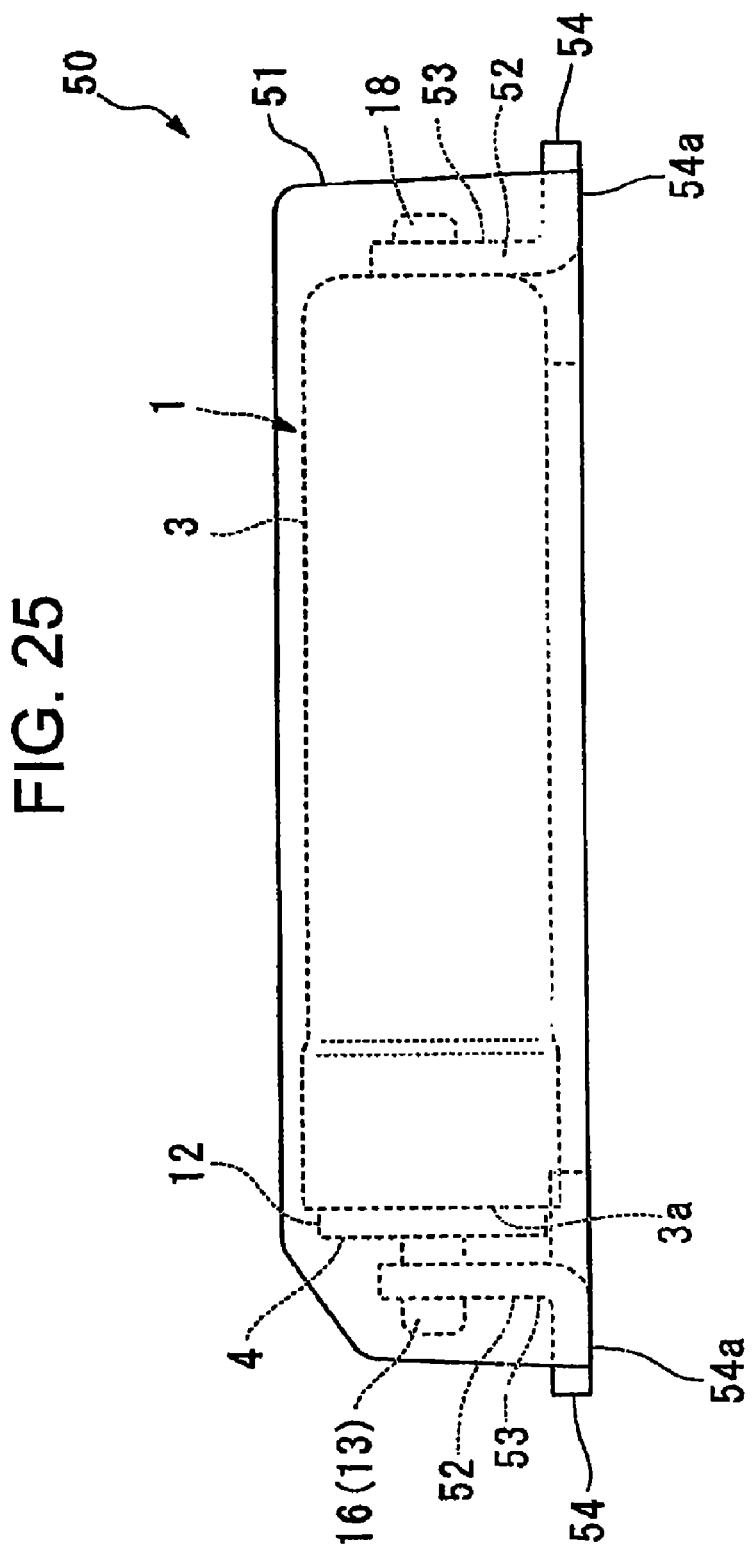
FIG. 25 shows a side view depicting a piezoelectric oscillator according to a second embodiment of the invention.
Figure 26:
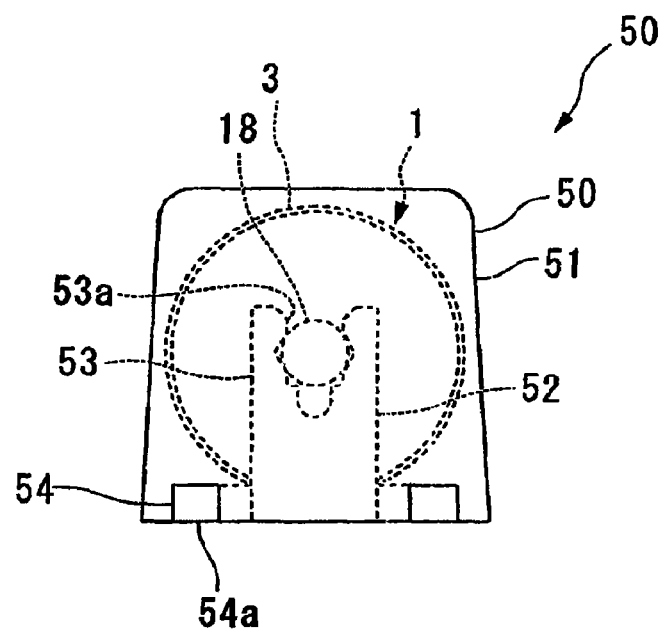
FIG. 26 shows a front view depicting the piezoelectric oscillator according to the second embodiment of the invention.

FIGS. 25 and 26 each show a second embodiment of the invention. In the embodiment, the members overlapping with the members used in the embodiment described above are designated the same numerals and signs, omitting explanations.

As shown in FIGS. 25 and 26, this piezoelectric oscillator 50 according to the embodiment is a surface mounted piezoelectric oscillator in which the piezoelectric oscillator 1 according to the first embodiment is resin molded. More specifically, the piezoelectric oscillator 50 includes a case 3, a hermetic terminal 4 which hermetically seals an opening 3a of the case 3, a piezoelectric vibrating piece 2, not shown, arranged inside the case 3, and a resin body 51 which is formed of a resin for covering the case 3, a first outer lead portion 16 and a second outer lead portion 18. To each of the first outer lead portion 16 and the second outer lead portion 18, an external terminal 52 is connected. The external terminal 52 includes a fitting portion 53 having a V-shape groove 53a into which the first outer lead portion 16 or the second outer lead portion 18 are fit, and an external connecting part 54 provided at the lower end of the fitting portion 53 and having a face 54a exposed outside the resin body 51.

Also in the piezoelectric oscillator 50 like this, the excitation electrodes, not shown, provided on both surfaces of the piezoelectric oscillator are not short circuited to each other, and the size can be reduced, as well as the piezoelectric oscillator 50 can be readily fabricated. For example, for the outer shape of the resin body 51, such a piezoelectric oscillator can be implemented in which one side is 1.1 mm or below in the cross section and the length is 4.3 mm or below.

On this account, the piezoelectric oscillator 50 can be mounted on a substrate with a smaller space, and the space on the substrate can be saved.

Third Embodiment

Figure 27:
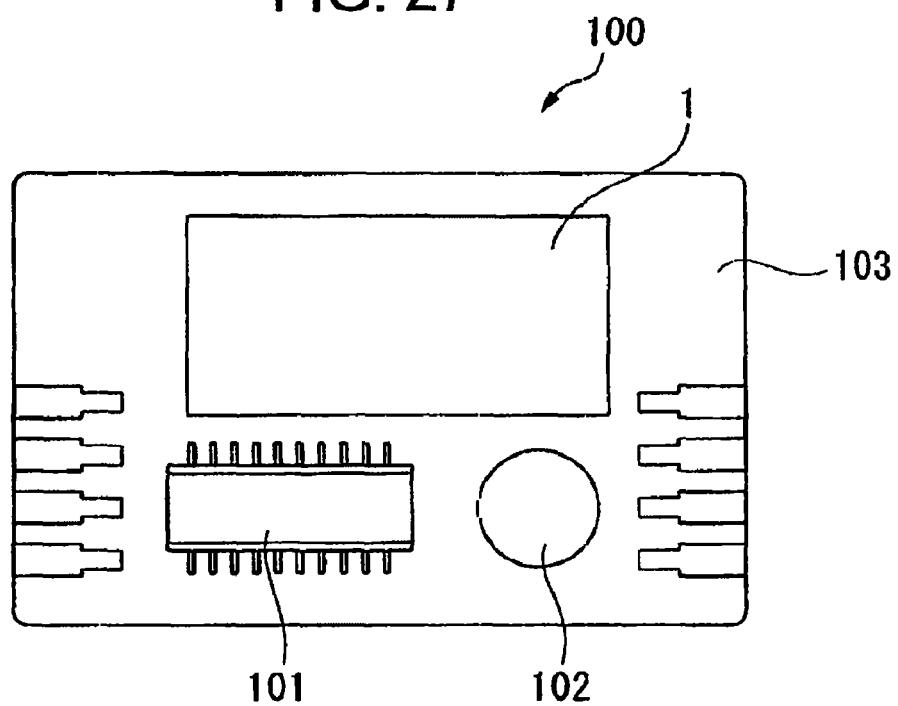
FIG. 27 shows a schematic diagram depicting an oscillator according to a third embodiment of the invention.

FIG. 27 shows a third embodiment of the invention. In the embodiment, the members overlapping with the members used in the embodiment described above are designated the same numerals and signs, omitting explanations.

FIG. 27 shows a schematic diagram depicting the configuration of a tuning fork quartz crystal oscillator according to the invention, showing a plan view depicting a surface mounted piezoelectric oscillator using the piezoelectric oscillator discussed above. As shown in FIG. 27, in this oscillator 100 according to the embodiment, a cylinder package piezoelectric oscillator 1 is configured as an oscillating element electrically connected to an integrated circuit 101. In addition, the piezoelectric oscillator 1 is the same as that of the first embodiment, omitting the explanations. The oscillator 100 has a substrate 103 on which an electronic component 102 such as a condenser is mounted. The substrate 103 is mounted with the integrated circuit 101 for the oscillator, and the piezoelectric oscillator 1 is mounted near the integrated circuit 101. The electronic component 102, the integrated circuit 101 and the piezoelectric oscillator 1 are electrically connected to each other through a wiring pattern, not shown. In addition, the individual components are molded with a resin, not shown.

In the oscillator 100 thus configured, voltage is applied to the piezoelectric oscillator 1, a piezoelectric vibrating piece 2 in the piezoelectric oscillator 1 is oscillated, and the vibrations are converted into electric signals by the piezoelectric property of quartz crystal and inputted to the integrated circuit 101 as electric signals. The inputted electric signals are processed variously by the integrated circuit 1001, and outputted as frequency signals. Thus, the piezoelectric oscillator 1 functions as an oscillating element. In addition, for example, in the configuration of the integrated circuit 1001, an RTC (real time clock) module is selectively set in accordance with demands, whereby in addition to a single-function oscillator for clocks, such a function can be added that controls the operation dates and times of the oscillator and external devices or provides times and calendars.

As discussed above, in accordance with the oscillator 100 according to the embodiment, the small-sized piezoelectric oscillator 1 with no short circuits is included to provide a small-sized, highly reliable oscillator.

In addition, the oscillator 100 is described as it includes the cylinder package piezoelectric oscillator 1, but which is not limited thereto, and which may include the surface mounted package piezoelectric oscillator 50 shown in the second embodiment, for example.

Fourth Embodiment

Figure 28:
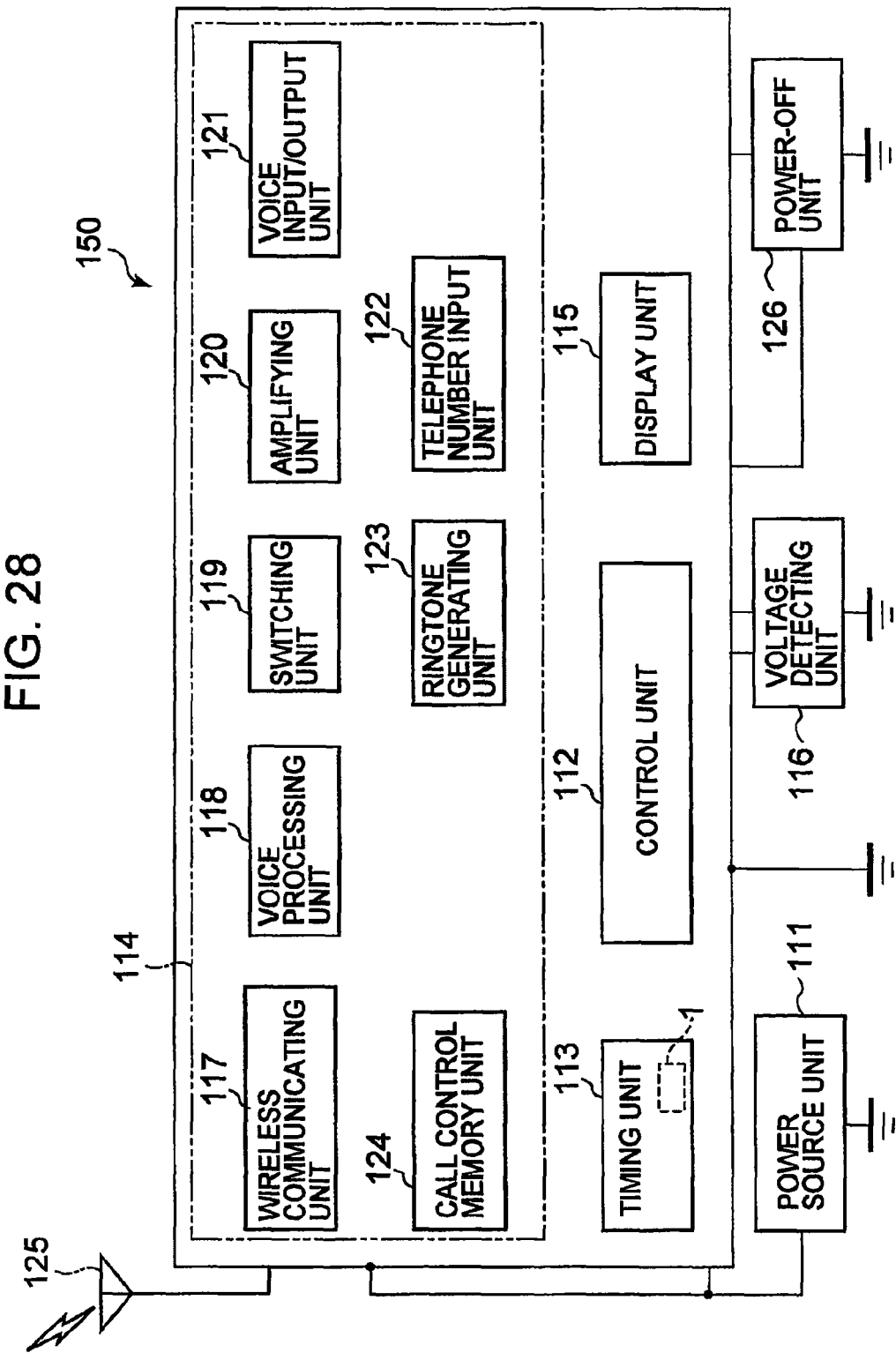
FIG. 28 shows a block diagram depicting an electronic appliance according to a fourth embodiment of the invention.

FIG. 28 shows a fourth embodiment of the invention. In the embodiment, the members overlapping with the members used in the embodiment described above are designated the same numerals and signs, omitting explanations.

In the embodiment, as an electronic appliance, a portable information device having the piezoelectric oscillator 1 described above is taken and described as an example. FIG. 28 shows a block diagram depicting the configuration of this electronic appliance. As shown in FIG. 28, the portable information device 110 according to the embodiment has the piezoelectric oscillator 1 and a power supply part 111 for supplying electric power. For example, the power supply part 111 is configured of a lithium secondary battery. To the power supply part 111, the following functional blocks are connected in parallel with each other: a control part 112 which performs various controls, a clock part 113 which counts time, a communicating part 114 which communicates with external devices, a display part 115 which displays various items of information, and a voltage detecting part 116 which detects voltage in the individual functional blocks. Then, the power supply part 111 supplies electric power to the individual functional blocks.

The control part 112 controls the individual functional blocks to perform operation control over the entire system such as sending and receiving sound data, measuring current time, and display. In addition, the control part 112 has a ROM in which a program is written in advance, a CPU which reads and performs the program written in the ROM, and a RAM used as the work area for the CPU.

The clock part 113 has an integrated circuit having an oscillation circuit therein, a register circuit, a counter circuit and an interface circuit and the piezoelectric oscillator 1. Voltage is applied to the piezoelectric oscillator 1, the piezoelectric vibrating piece 2 is then oscillated, and the vibrations are converted into electric signals by the piezoelectric property of quartz crystal, and inputted to the oscillation circuit as electric signals. The output of the oscillation circuit is binarized, and counted by the register circuit and the counter circuit. Then, through the interface circuit, signals are sent and received with the control part 112, and the current time and current date or calendar information are displayed on the display part 115.

The communicating part 114 has a function similar to that of a mobile telephone before, including a radio part 117, a sound processing part 118, a switching part 119, an amplifying part 120, a sound input/output part 121, a telephone number input part 122, a ringtone generating part 123 and a call control memory part 124. The radio part 117 sends and receives various items of data such as sound data with a base station through an antenna 125. The sound processing part 118 encodes and decodes sound signals inputted from the radio part 117 or the amplifying part 120. The amplifying part 120 amplifies the signals inputted from the sound processing part 118 or the sound input/output part 121 to a predetermined level. The sound input/output part 121 is configured of a speaker and a microphone, which makes a ringtone or a received call loud or collects sounds.

In addition, the ringtone generating part 123 generates a ringtone in response to calling from the base station. The switching part 119 switches the amplifying part 120 connected to the sound processing part 118 to the ringtone generating part 123 only when a call is received, whereby the ringtone generated in the ringtone generating part 123 is outputted to the sound input/output part 121 through the amplifying part 120. In addition, the call control memory part 124 stores therein a program for control of calling and called communications. In addition, the telephone number input part 122 has number keys 0 to 9 and other keys, for example, and these number keys are pressed to input the telephone number of a destination call.

In the case in which voltage applied to the individual functional blocks such as the control part 112 by the power supply part 111 is below a predetermined value, the voltage detecting part 116 detects this voltage drop and informs the control part 112 of the voltage drop. A predetermined voltage value at this time is a preset value as the minimum voltage necessary to stably operate the communicating part 114, for example, about 3 V. The control part 112 informed of the voltage drop from the voltage detecting part 116 disables the operations of the radio part 117, the sound processing part 118, the switching part 119 and the ringtone generating part 123. Particularly, it is required to stop the operation of the radio part 117 of large power consumption. Moreover, the display part 115 displays that the communicating part 114 is disabled for use because of battery shortage.

In other words, the voltage detecting part 116 and the control part 112 can disable the operation of the communicating part 114, and show this on the display part 115. This representation may be a text message, and for more intuitive representation, an X (cross) mark may be put on a telephone icon shown on the upper part of the display surface of the display part 115. In addition, the portable information device 110 has a power source breaker 126 which can selectively shut down the power source for the function of the communicating part 114, and the power source breaker 126 reliably disables the function of the communicating part 114.

In accordance with the portable information device 110 according to the embodiment, the small-sized piezoelectric oscillator 1 with no short circuits is included to provide a small-sized, highly reliable portable information device.

In addition, the portable information device 10 is described as it includes the cylinder package piezoelectric oscillator 1, but which is not limited thereto. For example, it may include the surface mounted package piezoelectric oscillator 50 shown in the second embodiment. The packaged piezoelectric oscillator 50 is preferable because it can be connected on a printed wiring board by reflow soldering together with other electronic components at the same time.

Fifth Embodiment

Figure 29:
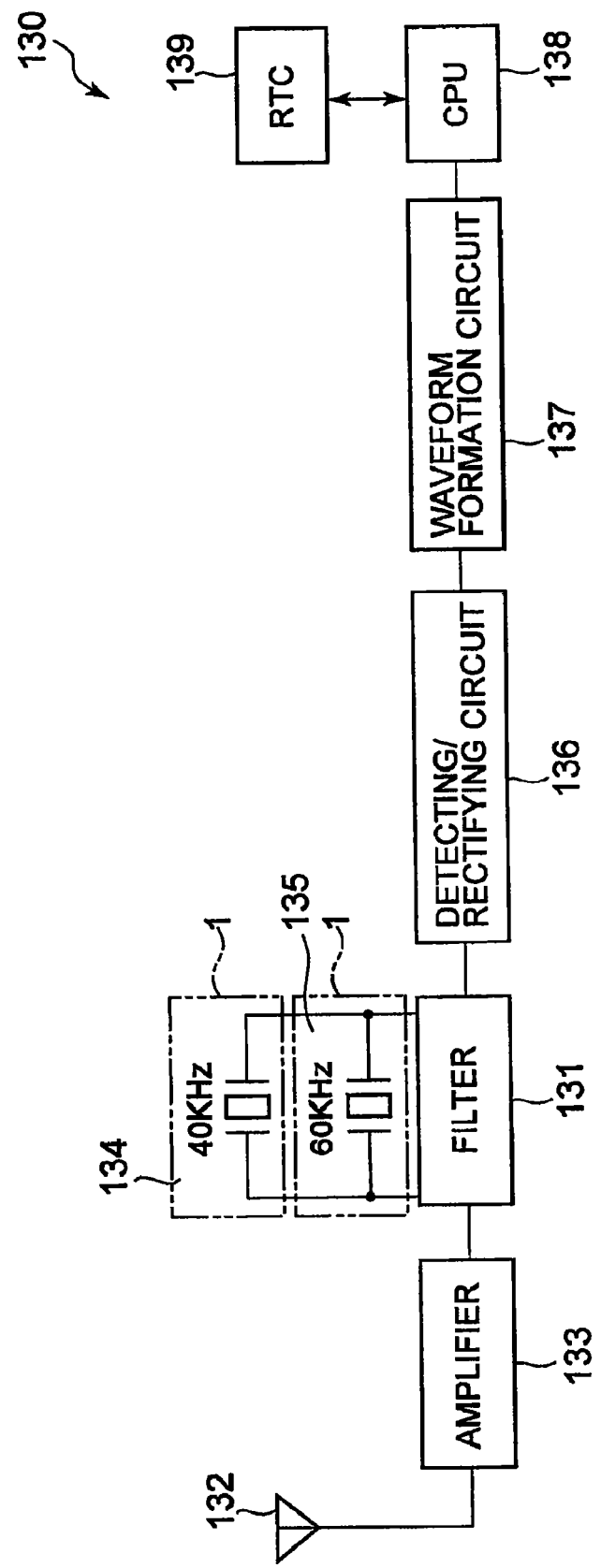
FIG. 29 shows a block diagram depicting a radio clock according to a fifth embodiment of the invention.

FIG. 29 shows a fifth embodiment of the invention. In the embodiment, the members overlapping with the members used in the embodiment described above are designated the same numerals and signs, omitting explanations.

In the embodiment, as an embodiment of a radio clock, a radio clock which has the piezoelectric oscillator 1 described above will be described. FIG. 29 shows a block diagram depicting the configuration of the radio clock. As shown in FIG. 29, the radio clock 130 according to the embodiment has the piezoelectric oscillator 1 electrically connected to a filter part 131, which is a clock having a function that receives standard radio waves including clock information and automatically corrects the radio waves to accurate time for display. In Japan, there are two transmitting stations (sending station) that send standard radio waves in Fukushima prefecture (40 kHz) and Saga prefecture (60 kHz), each sending standard radio waves. Since a long wave of 40 kHz or 60 kHz has a property of propagating through the earth's surface as well as a property of propagating while reflected in ionospheric layers and the earth's surface, the wave has a wide propagating area, covering throughout Japan with the two transmitting stations.

An antenna 132 receives standard radio waves of a 40 kHz or 60 kHz long wave. Standard radio waves of the long wave are waves in which time information called time code is amplitude modulated to a carrier wave of 40 kHz or 60 kHz. The received standard radio waves of the long wave are amplified by an amplifier 133, and filtered and tuned by the filter part 131 having a plurality of the piezoelectric oscillators 1. In addition, as the piezoelectric oscillator 1, piezoelectric oscillator parts 134 and 135 are provided having resonance frequencies of 40 kHz and 60 kHz, respectively, the same as the carrier frequencies.

Moreover, the filtered signals at a predetermined frequency are detected and demodulated by a detector and rectifier circuit 136. Then, the time code is taken out through a waveform shaping circuit 137, and counted by a CPU 138. The CPU 138 reads information such as the current year, the day of a year, the day of a week, and time. The read information is reflected in a RTC 139, and accurate time information is displayed. Since the carrier wave is 40 kHz or 60 kHz, preferably, the piezoelectric oscillator parts 134 and 135 are the piezoelectric oscillator having the tuning fork structure described above. In the example of 60 kHz, for exemplary dimensions of a tuning fork oscillator piece, it can be configured in such dimensions that the overall length is about 2.8 mm, and the width dimension of the base portion is about 0.5 mm.

In accordance with the radio clock 130 according to the embodiment, the small-sized piezoelectric oscillator 1 with no short circuits is included to provide a small-sized, highly reliable radio clock.

In addition, the radio clock 130 is described as it includes the cylinder package piezoelectric oscillator 1, but which is not limited thereto. For example, it may include the surface mounted package piezoelectric oscillator 50 shown in the second embodiment.

As discussed above, the embodiments of the invention have been described in detail with reference to the drawings. The vibration mode is not limited to bending oscillation of the tuning fork, which may be other vibration mode such as the thickness-shear vibration mode by other vibrating pieces. In addition, the material for a piezoelectric product is not limited to quartz crystal, which may be piezoelectric materials such as lithium niobate, lithium tantalate, and langasite. Moreover, the specific configuration is not limited to these embodiments, which includes design

What is claimed is:

1. A method of fabricating a hermetic terminal having an annular ring, a lead arranged to penetrate through the ring in which one end side thereof is an inner lead portion electrically connected to a piezoelectric vibrating piece and the other end side thereof is an outer lead portion electrically connected to outside as the ring is between them, and a filler fixing the lead to the ring, wherein the hermetic terminal seals the piezoelectric vibrating piece inside a case, the method comprising the steps of:

joining and firing wherein a bar-shaped member to be the lead is inserted into the ring through the filler, and they are fired in this state to form a hermetic terminal intermediate having the bar-shaped member fixed in the ring with the filler;

flattening wherein an end part of the bar-shaped member of the hermetic terminal intermediate to be the inner lead portion of the lead is flattened to form a stair portion; and shaping wherein at least an end part of the stair portion is cut to shape the stair portion into a predetermined shape, wherein in the joining and firing step, a solid round bar longer than the lead is used as the bar-shaped member, and one end side of the bar-shaped member to be the inner lead portion is inserted into the ring so that the one end side is longer than the inner lead portion in the hermetic terminal as a completed product.

2. The method of fabricating a hermetic terminal according to claim 1,
wherein, the lead is a single lead.

3. The method of fabricating a hermetic terminal according to claim 1,
wherein in the joining and firing step, one end side of the bar-shaped member to be the inner lead portion is inserted into the ring so that the one end side is longer than the inner lead portion of the hermetic terminal as a completed product in a range of 1.5 times to 3 times.

4. The method of fabricating a hermetic terminal according to claim 1,
wherein between the joining and firing step and the flattening step, the step of setting is provided wherein the hermetic terminal intermediate after the joining and firing step is set in a holding member.

5. A hermetic terminal fabricated by the method of fabricating a hermetic terminal according to claim 1.

6. A method of fabricating a piezoelectric oscillator including:
a piezoelectric vibrating piece,
a case having an opening for accommodating the piezoelectric vibrating piece therein; and
a hermetic terminal having an annular ring, a lead arranged to penetrate through the ring in which one end side thereof is an inner lead portion electrically connected to a piezoelectric vibrating piece and the other end side thereof is an outer lead portion electrically connected to outside as the ring is between them, and a filler fixing the lead to the ring, wherein the hermetic terminal seals the piezoelectric vibrating piece inside a case,
wherein the hermetic terminal is fabricated by the fabricating method according to claim 1.

7. A piezoelectric oscillator fabricated by the method of fabricating a piezoelectric oscillator according to claim 6.

8. The piezoelectric oscillator according to claim 7,
wherein the case is configured with conductivity;
the ring has:
a press fitting portion press fitted into an opening of the case, and
a reducing portion extended from the press fitting portion with a clearance to the inner side surface of the case with conductivity,
the lead is a single lead, and
the piezoelectric vibrating piece in a plate shape is arranged in the case and has an excitation electrode on each of two surfaces thereof, wherein one of the excitation electrodes is connected to the inner lead portion of the lead through a bump, whereby the piezoelectric vibrating piece is supported by the inner lead portion, and the other one on the opposite side of the excitation electrode is wire bonded to the outer side surface of the reducing portion of the ring.

9. An oscillator comprising:
the piezoelectric oscillator according to claim 7 connected to an integrated circuit as an oscillating element.

10. An electronic appliance comprising:
the piezoelectric oscillator according to claim 7.

11. A radio clock comprising:
the piezoelectric oscillator according to claim 7 electrically connected to a filter part.

* * * * *